US009704559B2

United States Patent
Hayashi et al.

(10) Patent No.: US 9,704,559 B2
(45) Date of Patent: Jul. 11, 2017

(54) ELECTRONIC DEVICE

(71) Applicant: Renesas Electronics Corporation, Kawasaki-shi (JP)

(72) Inventors: Toru Hayashi, Kawasaki (JP); Motoo Suwa, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 312 days.

(21) Appl. No.: 14/452,363

(22) Filed: Aug. 5, 2014

(65) Prior Publication Data

US 2015/0043298 A1    Feb. 12, 2015

(30) Foreign Application Priority Data

Aug. 9, 2013  (JP) ................... 2013-166537

(51) Int. Cl.
*H05K 1/18* (2006.01)
*G11C 11/4076* (2006.01)
(Continued)

(52) U.S. Cl.
CPC .......... *G11C 11/4076* (2013.01); *G11C 5/063* (2013.01); *G11C 7/10* (2013.01);
(Continued)

(58) Field of Classification Search
CPC ...... H05K 1/0231; H05K 1/144–1/148; H05K 1/111; H05K 3/368; H05K 2201/10734; H05K 2201/10684; H01L 2224/8091
(Continued)

(56) References Cited

U.S. PATENT DOCUMENTS 6,438,014 B2    8/2002  Funaba et al.
6,628,538 B2 *  9/2003  Funaba .................... G11C 5/04
                                                257/E25.01
(Continued)

FOREIGN PATENT DOCUMENTS

JP    2001-256772 A    9/2001
JP    2003-085121 A    3/2003
(Continued)

OTHER PUBLICATIONS

Japanese Office Action for Patent Application No. 2013-166537, dated Dec. 15, 2016, and English translation thereof.

*Primary Examiner* — Tuan T Dinh
(74) *Attorney, Agent, or Firm* — McGinn IP Law Group, PLLC.

(57) ABSTRACT

An electronic device includes a mounting substrate, a first semiconductor component including a first semiconductor chip that operates in synchronization with a first clock signal and being mounted on a first semiconductor component mounting area of the mounting substrate, a second semiconductor component including a second semiconductor chip that operates in synchronization with a second clock signal and being mounted on a second semiconductor component mounting area of the mounting substrate, the second semiconductor component mounting area being next to the first semiconductor component mounting area, and a third semiconductor component including a third semiconductor chip that controls the first and second semiconductor chips and being mounted on a third semiconductor component mounting area of the mounting substrate, the third semiconductor component mounting area being next to the first and the second semiconductor component mounting areas.

11 Claims, 19 Drawing Sheets

(51) Int. Cl.
*G11C 5/06* (2006.01)
*G11C 7/10* (2006.01)

(52) U.S. Cl.
CPC .............. *H01L 2224/48091* (2013.01); *H01L 2224/48227* (2013.01); *H01L 2924/15311* (2013.01)

(58) Field of Classification Search
USPC ..... 361/760–764, 792–795, 803; 365/63, 65, 365/191
See application file for complete search history.

(56) References Cited

U.S. PATENT DOCUMENTS

| | | | |
|---|---|---|---|
| 6,970,369 B2 | 11/2005 | Funaba et al. | |
| 6,977,832 B2 | 12/2005 | Isa et al. | |
| 6,982,893 B2* | 1/2006 | Jakobs | G11C 11/4087 365/230.06 |
| 7,102,905 B2* | 9/2006 | Funaba | G11O 5/04 257/686 |
| 7,484,161 B2* | 1/2009 | Dell | G11C 5/04 714/52 |
| 7,745,915 B2 | 6/2010 | Suwa et al. | |
| 7,816,795 B2 | 10/2010 | Hayashi et al. | |
| 8,064,222 B2* | 11/2011 | Nishio | G06F 1/184 257/686 |
| 8,213,205 B2* | 7/2012 | Rajan | G11C 5/02 365/200 |
| 8,279,690 B1* | 10/2012 | Wang | G06F 13/4234 365/191 |
| 8,446,781 B1* | 5/2013 | Rajan | G06F 13/1678 365/189.03 |
| 8,526,267 B2 | 9/2013 | Suwa et al. | |
| 2005/0105319 A1* | 5/2005 | Baek | G09G 5/006 365/87 |
| 2008/0123303 A1* | 5/2008 | Sugano | G11O 5/00 361/728 |
| 2012/0250264 A1* | 10/2012 | Osanai | G11O 5/04 361/728 |
| 2013/0138898 A1 | 5/2013 | Osanai et al. | |

FOREIGN PATENT DOCUMENTS

| | | |
|---|---|---|
| JP | 2005-045274 A | 2/2005 |
| JP | 2006-237385 A | 9/2006 |
| JP | 2009-223854 A | 10/2009 |
| JP | 2012-8920 A | 1/2012 |
| JP | 2013-114416 A | 6/2013 |

* cited by examiner

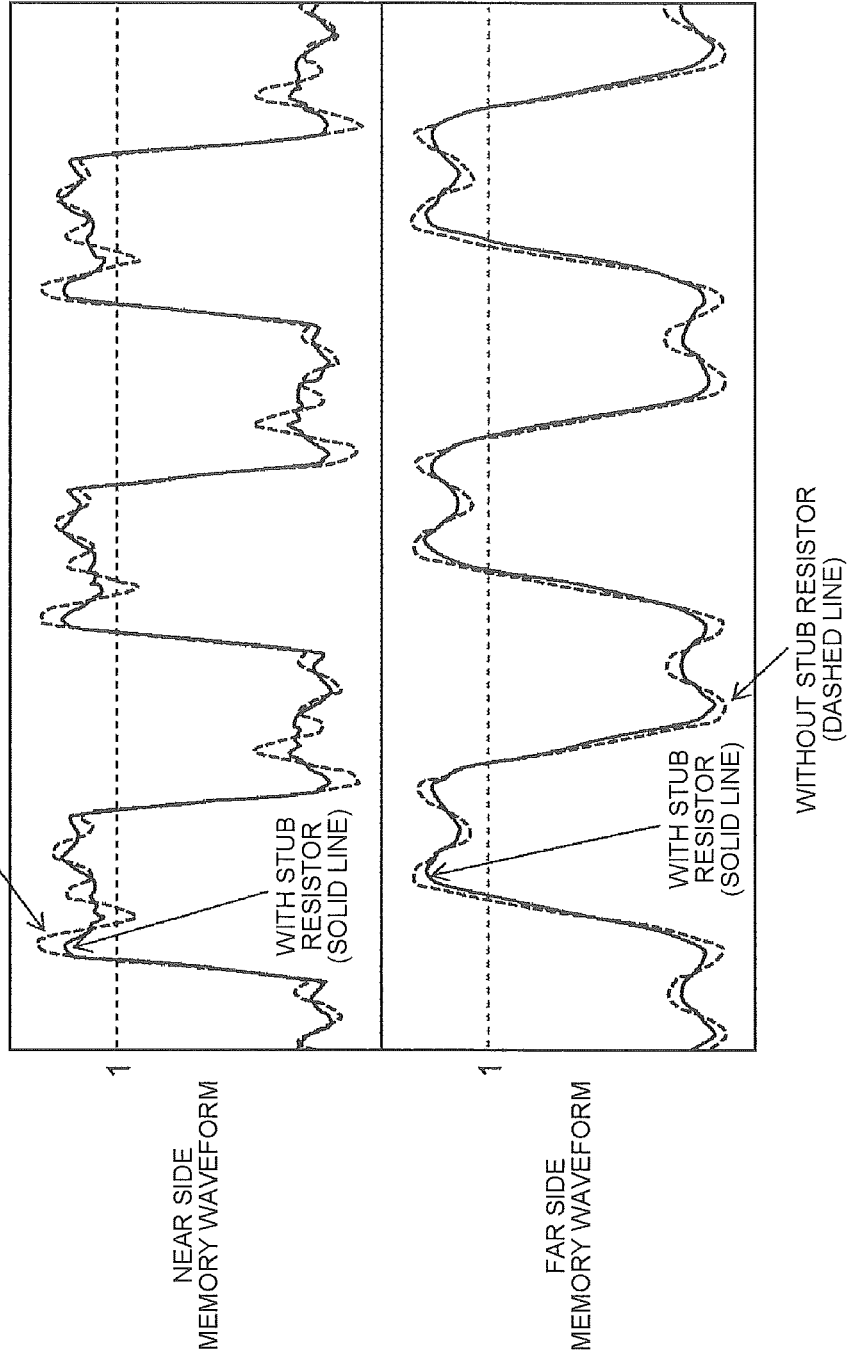

ELECTRONIC DEVICE

CROSS-REFERENCE TO RELATED APPLICATION

The disclosure of Japanese Patent Application No. 2013-166537 filed on Aug. 9, 2013 including the specification, drawings and abstract is incorporated herein by reference in its entirety.

BACKGROUND

The present invention relates to a mounting technology that couples, to one semiconductor component, a plurality of other semiconductor components in a fly-by mode, and for example, relates to a technology that is effective by being applied to an electronic device which is referred to as a mother board, a system board or the like, and in which a plurality of DDR3-SDRAMs (Double Data Rate3-SDRAMs) is mounted on a microcomputer in a fly-by mode over a mounting substrate.

There are the following examples of documents that describe quality improvement of signals of command/address, control system and the like, associated with memory access in an electronic device having a control device such as a microcomputer being a semiconductor component and a plurality of memory devices being a semiconductor component.

Japanese Patent Laid-Open No. 2006-237385 describes that a data system wiring is made shorter than a command/address system wiring when a microcomputer and a plurality of memory devices are mounted on a mounting substrate. The data system wiring is laid down by using a free space between the memory devices. The command/address system wiring bypasses the side of the mounting substrate. Thereby, it is possible to reduce wiring impedance of wirings of data and data strobe system and achieve shortening of the wirings.

Japanese Patent Laid-Open No. 2009-223854 describes measures to easily align a phase difference between a command/address signal and a clock signal due to a difference of signal load in the case where a microcomputer controls a plurality of DDR-SDRAMs and when a clock wiring is shared by the DDR-SDRAMs in order to reduce the crock wiring. Here, the command/address signal can be outputted earlier than the cycle start phase of the clock signal.

Japanese Patent Laid-Open No. 2012-8920 describes measures for a case where a system board in which a plurality of DIMMs (Dual Inline Memory Modules) is mounted has a T-junction structure and a fly-by structure as wiring structures in the DIMMs and the difference between the structures cannot be dealt with by only timing control such as leveling control by a memory controller. Here, capacitance element is interposed in a path that branches from a propagation path of a control system signal such as an enable signal on which the leveling control is performed and that reaches a ground plane. The capacitance element functions as a short path for a harmonic component of the control system signal, and thus the capacitance element can enhance the signal quality of the control system signal.

SUMMARY

The inventors of the present application have studied a module product (an electronic device) on which memory devices (semiconductor components including a memory chip) and a control device that controls the memory devices (a semiconductor device including a control chip that controls the above memory chips) are mixed and mounted.

An existing memory device (or a memory chip mounted on the memory device) has a small (low) storage capacity (degree of integration) per device (per unit) of, for example, 512 Mb (megabits). Therefore, in the case of increasing the storage capacity of the module product to, for example, 16 Gb (gigabits), 32 memory devices of 512 Mb (or 32 memory devices including one memory chip of 512 Mb) are required to be used (mounted).

Here, if a large number of memory devices described above are directly mounted on a mother board of the module product, the size of the mother board increases and it is difficult to achieve size reduction of the module product.

Therefore, as illustrated in FIG. 11 in Japanese Patent Laid-Open No. 2012-8920, there is prepared a so-called DIMM in which a plurality of memory devices is mounted on an interposer (wiring substrate) different from a mother board of a module product and there is employed the module product in which the interposer of the DIMM is inserted (coupled) to a connector provided on the mother board.

However, in recent years, the storage capacity per memory device (memory chip) has increased. Therefore, when a module product having the same capacity as before (for example, 16 Gb) is manufactured, it is possible to reduce the number of memory devices to be used.

Furthermore, in recent years, cost reduction of electronic devices has been required.

Therefore, the present inventors have studied a case where a plurality of memory devices is directly mounted, without using the interposer, on a mounting substrate on which a control device is mounted, and have found a problem described below.

First, in a module product on which memory devices operating at high speed and a control device that controls the memory devices are mixed and mounted, the wiring load is more reduced and deterioration of signal waveform quality is more suppressed when a wiring topology of the fly-by structure is employed than when a wiring topology of the T-junction structure is employed. Furthermore, the wiring topology of the fly-by structure is preferable in realizing a high-speed operation.

However, when each of the memory devices operating at high speed and the control device that controls each of the memory devices are coupled in a fly-by coupling mode (fly-by topology), it is known that the signal waveform is disturbed as shown FIG. 21.

Meanwhile, the cause of this is because the lengths of branch wirings which branch from a main wiring and which electrically couple the control device to the memory devices become long and the effect of undesired signal reflection in the branch wirings cannot be ignored.

The above and other problems and new features of the present invention will become clear from the description of the present specification and the accompanying drawings.

Means for Solving the Problems

The following explains briefly the outline of a typical embodiment among the embodiments disclosed in the present application.

On a mounting substrate on which a plurality of first semiconductor components that operates in synchronization with a clock signal and a second semiconductor component that controls the first semiconductor components, a plurality of main wirings and branch wirings branched at a plurality of branch points of each of the main wirings are provided, as signal paths that electrically couple the second semiconductor component with the first semiconductor components. A chip resistor is coupled in series in the midway of branch wirings that reach a corresponding first semiconductor component from the branch points which do not overlap the first semiconductor component and which are located away from the first semiconductor component.

Effect of the Invention

The following explains briefly the effect acquired by the typical embodiment among the embodiments disclosed in the present application.

Namely, a chip resistor inserted in a branch wiring of a main wiring by the fly-by topology can alleviate the effect of undesired signal reflection in the branch wiring even if the length of the path branched from the main wiring is long.

BRIEF DESCRIPTION OF THE DRAWINGS

FIG. 21 is a waveform diagram showing command/address signal waveforms when the branch wirings become undesirably long.

DETAILED DESCRIPTION

1. Overview of Embodiment

Figure 1:
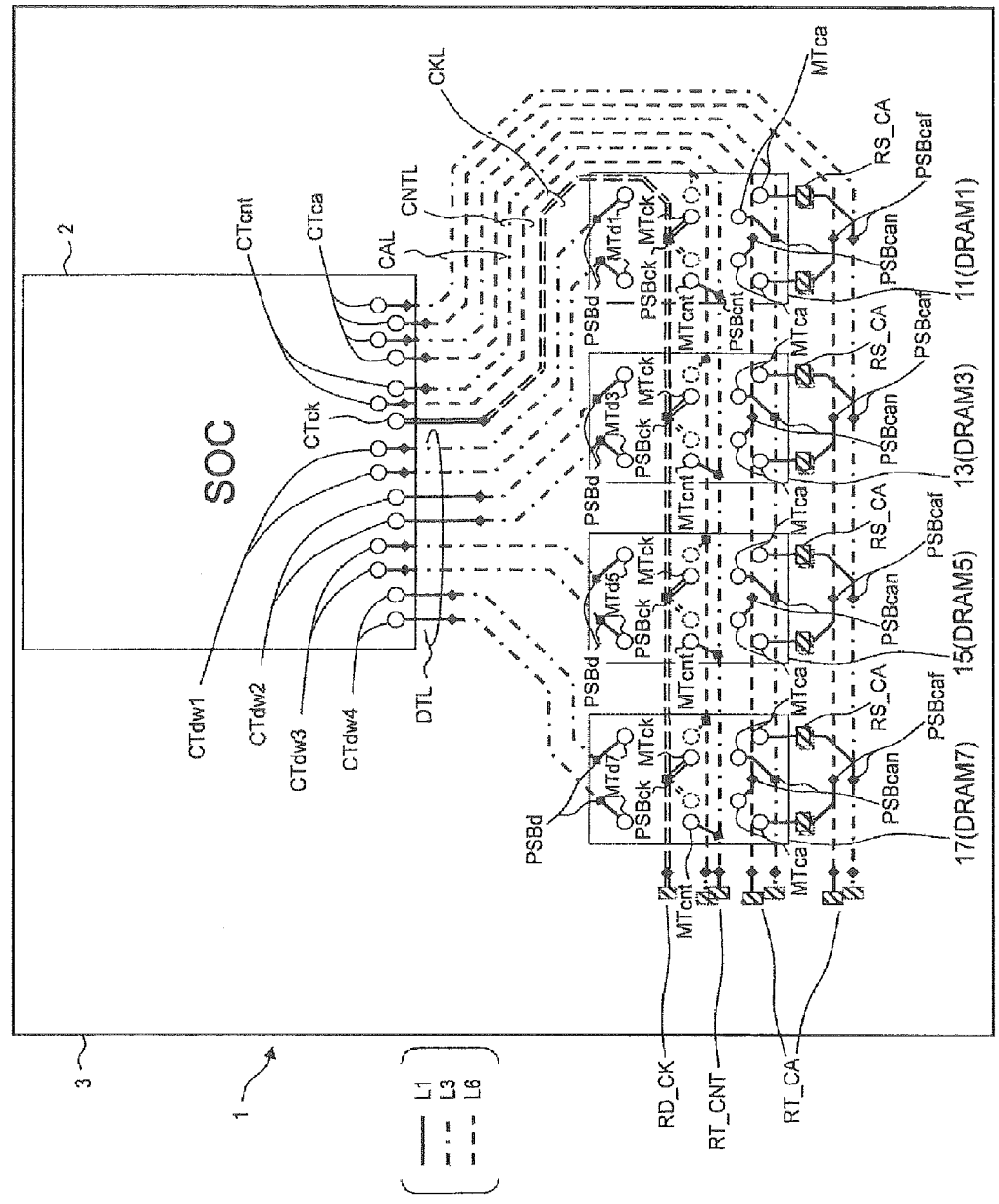
FIG. 1 is an explanatory diagram illustrating an upper surface through which wirings are seen as an example of an electronic device.

First, an overview of an embodiment disclosed in the present application will be described. A reference symbol in a drawing referred to in parentheses in an overview of the embodiment only illustrates a component included in a concept of a component denoted by the reference symbol.

[1] Insertion of Chip Resistor in Branch Wiring of Main Wiring by Fly-By Topology An electronic device (1) includes a mounting substrate (3), a first semiconductor component (11), a second semiconductor component (17), and a third semiconductor component (2). The first semiconductor component has a first semiconductor chip (11_CHP) which operates in synchronization with a clock signal, and is mounted on a first semiconductor component mounting area (21) of the mounting substrate. The second semiconductor component has a second semiconductor chip that operates in synchronization with the clock signal and is mounted on a second semiconductor component mounting area (27) of the mounting substrate located next to the first semiconductor component mounting area. The third semiconductor component has a third semiconductor chip (2_CHP) that controls the first semiconductor chip and the second semiconductor chip and is mounted on a third semiconductor component mounting area (20) of the mounting substrate next to the first and the second semiconductor component mounting areas. The third semiconductor component is electrically coupled to the first semiconductor component and the second semiconductor component through main wirings (CALmn) provided on the mounting substrate and first branch wirings (CALsb_1) which are branched from the main wirings at first branch points (PSBcaf_1) of the main wiring and the main wirings (CALmn) and second branch wirings (CALsb_7) which are branched from the main wirings at second branch points (PSBcaf_4) of the main wirings, respectively. The first branch points and the second branch points are arranged outside the first semiconductor component mounting area and the second semiconductor component mounting area, respectively. A first chip resistor (RS_CA) and a second chip resistor (RS_CA) are coupled in series to the first branch wiring and the second branch wiring, respectively.

Therefore, the chip resistor coupled in series to each of the first branch wiring and the second branch wiring of the main wiring by the fly-by topology can alleviate the effect of undesired signal reflection in the branch wiring even if the length of the path branched from the main wiring is long. Therefore, when trying to realize high-speed access to the first and the second semiconductor devices from the third semiconductor device by directly mounting the first and the second semiconductor devices on the mounting substrate on which the third semiconductor device is mounted, by the fly-by topology, it is possible to suppress deterioration of the waveform quality of interface signal due to the fly-by topology.

[2] Memory Device, Control Device

In the electronic device described in section [1], the first semiconductor component and the second semiconductor component are a first memory device and a second memory device which are operated in synchronization with a clock signal, and the third semiconductor component is a control device that controls the first memory device and the second memory device.

According to this, when trying to realize high-speed access to the first and the second memory devices from the control device by directly mounting the first and the second memory devices on the mounting substrate on which the control device is mounted, by the fly-by topology, it is possible to suppress deterioration of the waveform quality of interface signal due to the fly-by topology. For example, if the first and the second memory devices are semiconductor memory devices such as DDR3-SRRAMs in accordance with the JEDEC (Joint Electron Device Engineering Councils) standard, the command/address terminals of the memory device are gathered on one side of the device, and thus it can be considered that all the branch points of the command/address signal branch wirings coupled to the command/address terminals often cannot be arranged so as to overlap the memory device near the command/address terminals. Furthermore, a clock signal that defines a cycle period of the command/address signals and a control system signal used for activation control of the memory devices are positioned as signals related to the effectiveness of all bits of the command/address signals, and thus it is regarded as effective to take into account shortening as much as possible of the branch wirings corresponding to such signals in the fly-by topology. In that sense, it is preferable that all or a part of the signal branch wirings corresponding to the command/address signals are allowed to be long and the disadvantage caused by that is solved by the chip resistors in order to reliably enhance the high-speed access performance to the memory devices.

[3] Command/Address Main Wiring, Command/Address Branch Wiring

In the electronic device described in section [2], the main wiring is a command/address signal main wiring and the branch wiring is a command/address signal branch wiring.

According to this, even when the command/address signal branch wiring is long with respect to the wiring path of the command/address signal, it is possible to alleviate the effect of reflection of the command/address signal in the wiring path of the command/address signal, and thus it is possible to suppress deterioration of the waveform of the command/address signal.

[4] Clock Signal Wiring that Couples Memory Devices in Fly-By Mode

In the electronic device described in section [3], a clock signal is supplied from the control device to the first memory device and the second memory device through a clock signal main wiring (CKLmn) provided on the mounting substrate and clock signal branch wirings (CKLsb_1, CKLsb_7) branched from the clock signal main wiring at first and second branch points (PSBck_1, PSBck_4) of the clock signal main wiring, respectively.

According to this, as long as the clock signal branch wiring in the wiring path of the clock signal does not become long, the effect of signal reflection in the wiring path is an ignorable level, and thus it is not necessary to insert a chip resistor. On the contrary, when the first and the second branch points of the clock signal main wiring are located in an area not overlapping the semiconductor memory device, in the same manner as the command/address signal, it is sufficient that a chip resistor may be inserted in the midway of the clock signal branch wirings coupled to the branch points.

[5] Output of Command/Address Signal in Synchronization with Cycle of Clock Signal In the electronic device described in section [4], the control device outputs the command/address signal to the command/address signal main wiring for each cycle of the clock signal to be output to the clock signal main wiring.

According to this, deterioration of the waveform quality of the command/address signals is suppressed, and thus extension of a determining period of the command/address signals to a plurality of cycles of the clock signal is not required, which is suitable for high-speed access to the memory devices.

[6] Control Signal Wiring that Couples Memory Devices in Fly-By Mode

In the electronic device described in section [4], a control signal is supplied from the control device to the first memory device and the second memory device via a control signal main wiring (CNTLmn) provided on the mounting substrate and control signal branch wirings (CNTLsb_1, CNTLsb_7) branched from the control signal main wiring at first and second branch points (PSBcnt_1, PSBcnt_4) of the control signal main wiring, respectively.

According to this, as long as the control signal branch wiring in the wiring path of the control signal does not become long, the effect of signal reflection in the wiring path is an ignorable level, and thus it is not necessary to insert a chip resistor. On the contrary, when the first and the second branch points of the control signal main wiring are located in an area not overlapping the semiconductor memory device, in the same manner as the command/address signal, it is sufficient that a chip resistor may be inserted in the midway of the control signal branch wirings coupled to the branch points.

[7] Data System Wirings that Individually Couple Memory Devices

In the electronic device described in section [5], the mounting substrate includes a first data system wiring (DTLmn, DTLsb_1) that couples the control device to the first memory device and a second data system wiring that couples the control device to the second memory device. The control device performs data input or output between the first memory device and the second memory device which are activated by the control signal.

According to this, the command/address signal and the clock signal are inputted with a difference of phase to the first memory device and the second memory device. This is because the path that supplies the signals has a fly-by topology. The data system wiring is individually coupled to each of the first memory device and the second memory device, and thus the difference of phase included in the command/address signal and the clock signal is formed in the output timing of the data system signal from the control device to the first memory device and the second memory device. The same applies to a case where the first memory device and the second memory device output read data. Therefore, the data output timing is deviated in accordance with the difference of phase, and thus it is possible to prevent power supply noise caused by an output operation of output buffer from being too large.

[8] Allowing "Distance Between Control Device and First Stage Branch Point<Maximum Distance Between Branch Points"

In the electronic device described in section [1], a wiring length from the first branch point (PSBcaf_1) to the second branch point (PSBcaf_4) farthest away from the first branch point is longer than a wiring length from the control device to the first branch point. For example, when a plurality of DIMMs is used, a wiring for supplying data signal from the control device to each DIMM is mainly coupled in a fly-by mode. Therefore, in securing signal quality, it is necessary to shorten as much as possible the wiring length from the branch point of DIMM coupled nearest the control device among a plurality of DIMMs coupled to this wiring (main wiring) to the branch point of DIMM farthest away from the control device.

In contrast to this, in the present embodiment, a plurality of memory devices is not configured by DIMMs, but directly placed (mounted) on the mounting substrate. In addition, as described above, the control device and each of the first memory device and the second memory device mounted on the same mounting surface as that of the first memory device are individually coupled to each other. Therefore, for example, when referring to the command/address signal, the wiring length from the first branch point (PSBcaf_1) to the second branch point (PSBcaf_4) farthest away from the first branch point is longer than the wiring length from the control device to the first branch point. However, as described above, the wiring for the data signal is individually coupled to each memory device, and thus the effect of the data signal on the signal quality is low.

[9] Insertion of Chip Resistor in Branch Wiring of Main Wiring by Fly-By Topology An electronic device (1) includes a mounting substrate (3), i×j (i is an integer greater than or equal to 2, j is a positive integer, and j<=i) first semiconductor components (11 to 18) and a second semiconductor component (2). Each of the i×j first semiconductor components has a first semiconductor chip (11_CHP, •) operating in synchronization with a clock signal, and is individually mounted on i×j device mounting areas (21 to 28) of the mounting substrate. The second semiconductor component includes a second semiconductor chip (2_CHP) controlling the i×j first semiconductor components (memory devices) and is mounted on an area next to the device mounting areas in the mounting substrate. The mounting substrate includes a plurality of first signal main wirings (CALmn) and first signal branch wirings (CALsb_1, 3, 5, and 7, CALsb_2, 4, 6, and 8) branched at i branch points (PSBcaf_1, 2, 3, and 4) of each of the first signal main wirings (command/address signal wirings), as a plurality of first signal paths that electrically couples the second semiconductor component with the i×j first semiconductor components. All or apart of the i branch points are arranged outside the device mounting areas in the mounting substrate. A chip resistor (RS_CA) is coupled in series in the midway of the first signal branch wirings branched from the all or a part of branch points.

According to this, the chip resistor coupled in series to each of the all or a part of the first signal branch wirings branched from the first signal main wiring of the fly-by topology can alleviate the effect of undesired signal reflection in the first signal branch wirings even if the length of the path branched from the first signal main wiring is long. Accordingly, when trying to realize high-speed access to the first semiconductor device from the second semiconductor device by directly mounting the first semiconductor device on the mounting substrate on which the second semiconductor device is mounted, by the fly-by topology, it is possible to suppress deterioration of the waveform quality of interface signal due to the fly-by topology.

[10] Memory Device, Control Device

In the electronic device described in section [9], the first semiconductor components are memory devices operated in synchronization with a clock signal. The second semiconductor component is a control device that can control the memory devices.

According to this, when trying to realize high-speed access to the i×j memory devices from the control device by directly mounting the i×j memory devices on the mounting substrate on which the control device is mounted, by the fly-by topology, it is possible to suppress deterioration of the waveform quality of interface signal due to the fly-by topology. If the i×j memory devices are semiconductor memory devices such as DDR3-SRRAMs in accordance with the JEDEC standard, the command/address terminals of the memory device are gathered on one side of the device, and thus it can be considered that all the branch points of the command/address signal branch wirings coupled to the command/address terminals often cannot be arranged so as to overlap the memory device near the command/address terminals. Furthermore, a clock signal that defines a cycle period of the command/address signals and a control system signal used for activation control of the memory devices are positioned as signals related to the effectiveness of all bits of the command/address signals, and thus it is regarded as effective to take into account shortening as much as possible of the branch wirings corresponding to such signals in the fly-by topology. In that sense, it is preferable that all or a part of the signal branch wirings corresponding to the command/address signals are allowed to be long and the disadvantage caused by that is solved by the chip resistors in order to reliably enhance the high-speed access performance to the memory devices.

[11] Command/Address Main Wiring, Command/Address Branch Wiring

In the electronic device described in section [10], the first signal main wiring is a command/address signal main wiring and the first signal branch wiring is a command/address signal branch wiring.

According to this, even when the command/address signal branch wiring is long with respect to the wiring path of the command/address signal, it is possible to alleviate the effect of reflection of the command/address signal in the wiring path of the command/address signal, and thus it is possible to suppress deterioration of the waveform of the command/address signal.

[12] Control i×j Memory Devices as Memory Modules of j Ranks

In the electronic device described in section [11], the control device controls the i×j memory devices as memory modules of j ranks of a unit of i modules.

According to this, it is possible to suppress deterioration of the waveform quality of interface signal even in the fly-by topology that can control the i×j memory devices, as memory modules of j ranks of a unit of i modules.

[13] Clock Signal Wiring that Couples Memory Devices in Fly-By Mode

In the electronic device described in section [12], the mounting substrate includes a clock signal main wiring (CKLmn) and clock signal branch wirings (CKLsb_1, 3, 5, and 7, CKLsb_2, 4, 6, and 8) branched at i branch points (PSBck_1, 2, 3, 4) of the clock signal main wiring, as a plurality of second signal paths that electrically couples the control device with the i×j memory devices.

According to this, as long as the clock signal branch wiring in the wiring path of the clock signal does not become long, the effect of signal reflection in the wiring path is an ignorable level, and thus it is not necessary to insert a chip resistor. On the contrary, when the branch point of the clock signal main wiring is located in an area not overlapping the semiconductor memory device, in the same manner as the command/address signal, it is sufficient that a chip resistor may be inserted in the midway of the clock signal branch wiring coupled to the branch point.

[14] Output of Command/Address Signal in Synchronization with Cycle of Clock Signal In the electronic device described in section [13], the control device outputs the command/address signal to the command/address signal main wiring for each cycle of the clock signal to be output to the clock signal main wiring.

According to this, deterioration of the waveform quality of the command/address signals is suppressed, and thus extension of a determining period of the command/address signals to a plurality of cycles of the clock signal is not required, which is suitable for high-speed access to the memory devices.

[15] Control Signal Wiring that Couples Memory Devices in Fly-By Mode

In the electronic device described in section [13], the mounting substrate includes a control signal main wiring (CNTLmn) provided on the mounting substrate for each group of i memory devices belonging to the same rank and control signal branch wirings (CNTLsb_1, 3, 5, and 7, CNTLsb_2, 4, 6, and 8) branched at i control signal branch points (PSBCnt_1, 2, 3, and 4) of the control signal main wiring, as a plurality of third signal paths that electrically couples the control device with the i×j memory devices. The control device outputs a control signal to the control signal main wiring for each group of the i memory devices belonging to the same rank.

According to this, as long as the control signal branch wiring in the wiring path of the control signal does not become long, the effect of signal reflection in the wiring path is an ignorable level, and thus it is not necessary to insert a chip resistor. On the contrary, when the branch point of the control signal main wiring is located in an area not overlapping the semiconductor memory device, in the same manner as the command/address signal, it is sufficient that a chip resistor may be inserted in the midway of the control signal branch wiring coupled to the branch point.

[16] Data System Wirings that Individually Couple Memory Devices

In the electronic device described in section [15], the mounting substrate includes a data system signal main wiring (DTLmn) which is individual for each memory device in the same rank and is commonly provided for each corresponding memory device between j ranks and j data system signal branch wirings (DTLsb_1, DTLsb_2) branched from the data system signal main wiring at a data system signal branch point, as a plurality of fourth signal paths that electrically couples the control device with the i×j memory devices. The control device performs data input or output among the control device and memory devices in a rank activated by the control signal.

According to this, the command/address signal and the clock signal are inputted with a difference of phase to a plurality of memory devices in the same rank. This is because the path supplying the signals has a fly-by topology. The data system wiring is individually coupled to each of the memory devices in the same rank, and thus the difference of phase included in the command/address signal and the clock signal is formed in the output timing of the data system signal from the control device to the memory devices in the same rank. The same applies to a case where the memory devices in the dame rank output read data. Therefore, the data output timing is deviated in accordance with the difference of phase, and thus it is possible to prevent power supply noise caused by an output operation of output buffer from being too large.

2. Details of Embodiment

The embodiment will be described in further detail.
Electronic Device (Electronic Equipment, Module Product)

Figure 2:
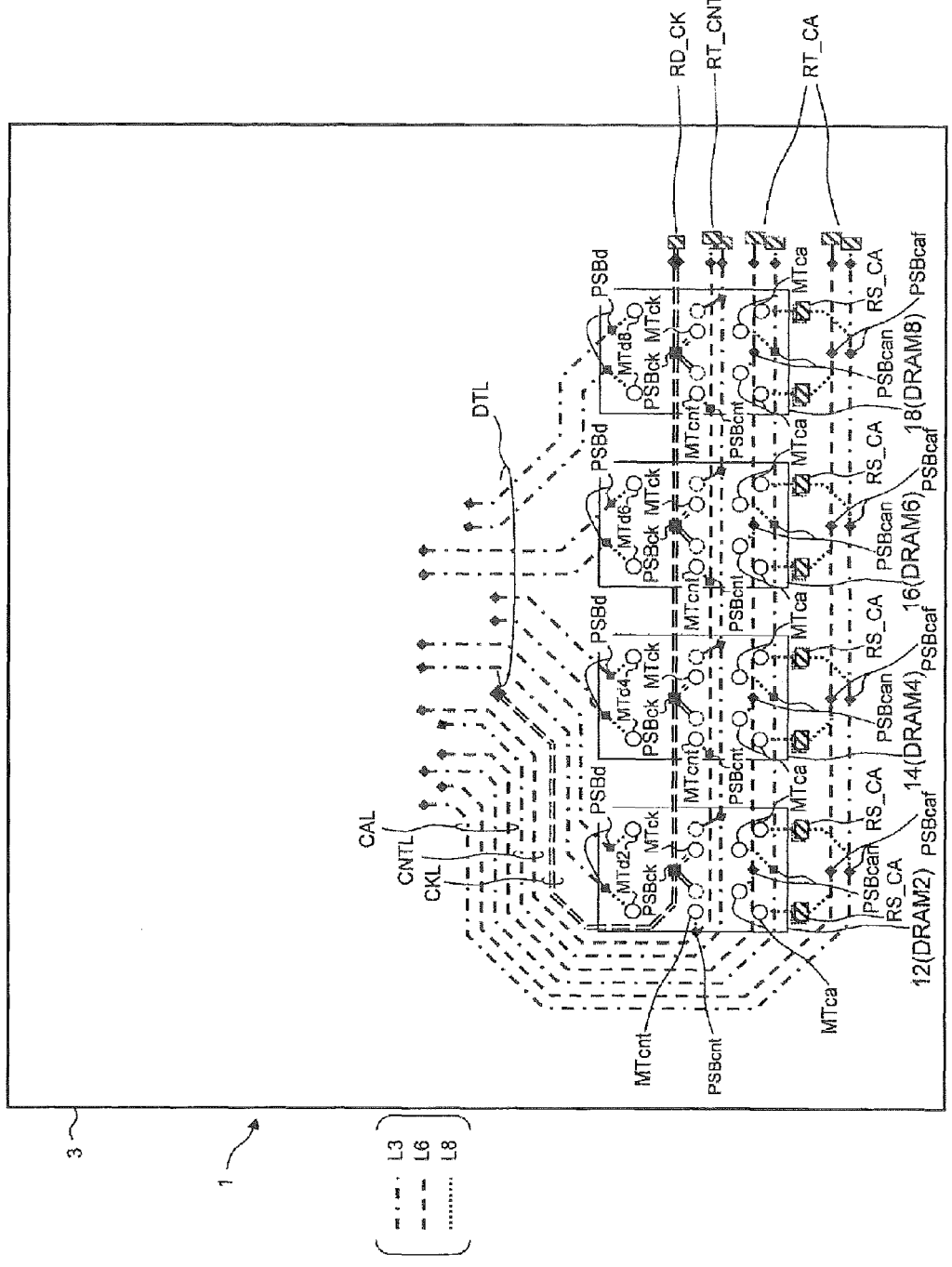
FIG. 2 is an explanatory diagram illustrating a lower surface through which the wirings are seen as an example of the electronic device.
Figure 3:
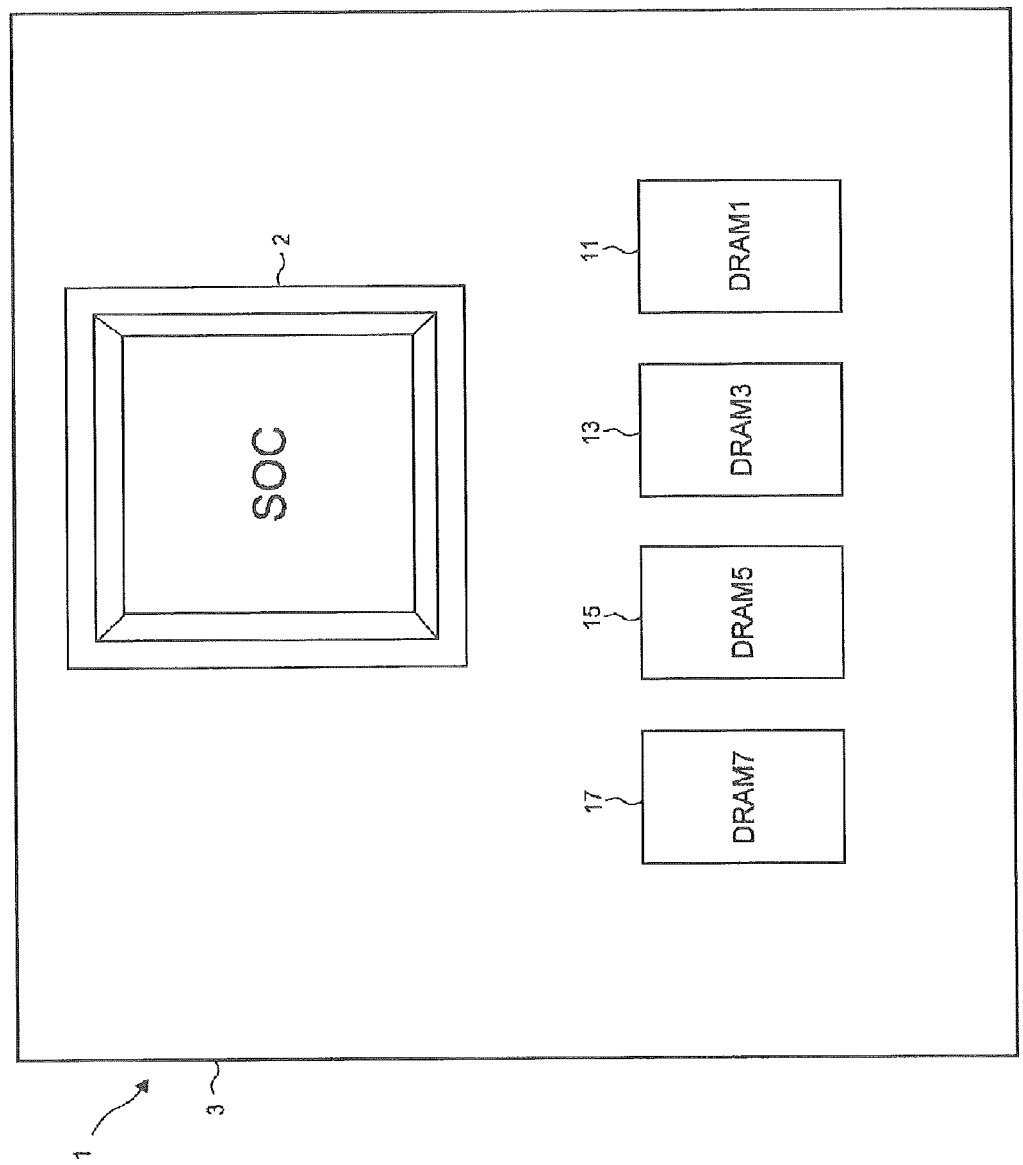
FIG. 3 is an explanatory diagram illustrating the upper surface when the wirings are not seen through the upper surface.
Figure 4:
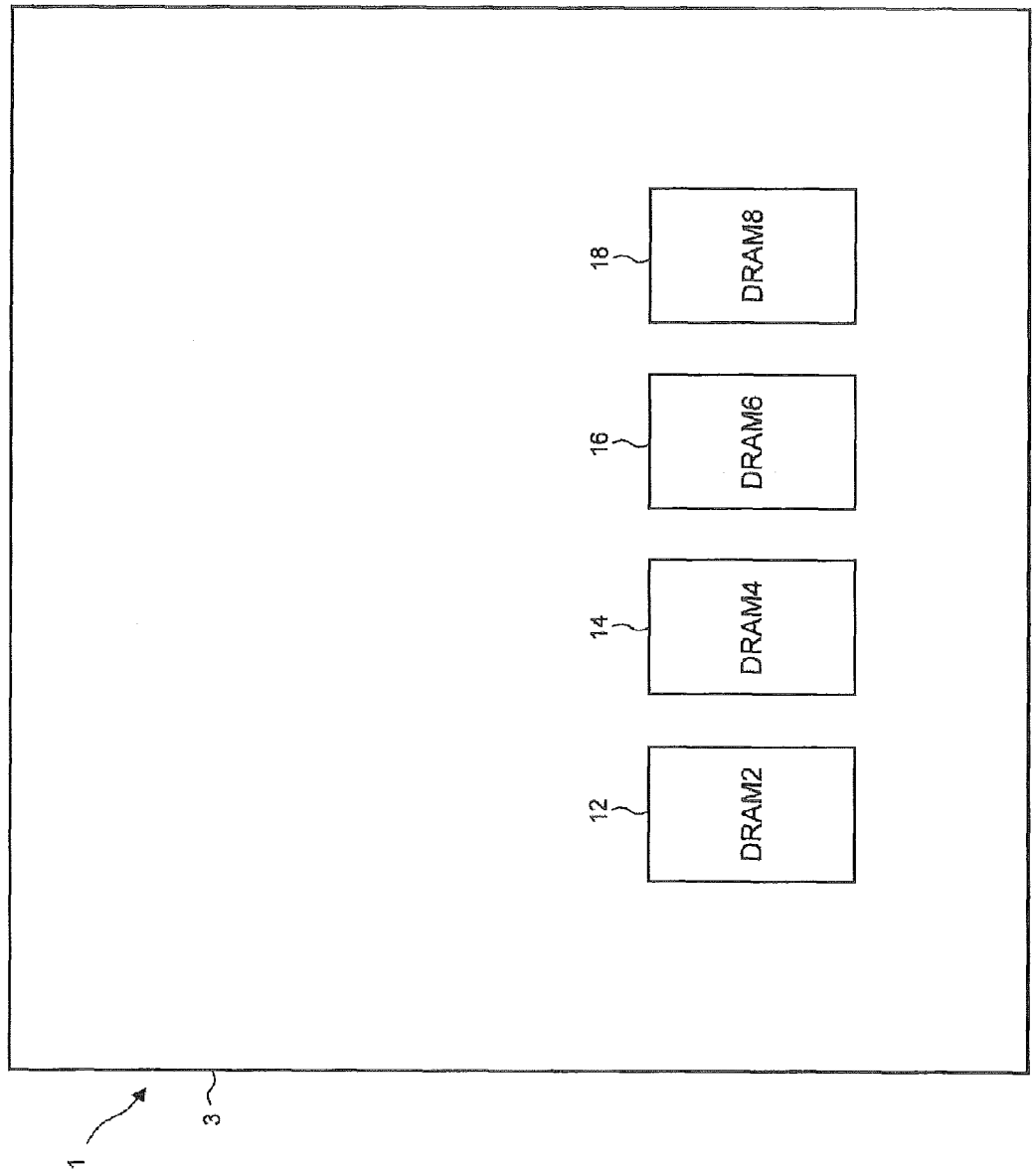
FIG. 4 is an explanatory diagram illustrating the lower surface when the wirings are not seen through the lower surface.

As an example, FIG. 1 is a diagram of an upper surface (front surface) of a mother board when wirings are seen through, FIG. 2 is a diagram of a lower surface (back surface) of the mother board when the wirings are seen through, and FIG. 3 is a diagram of the upper surface when the wirings are not seen through, and FIG. 4 is a diagram of the lower surface when the wirings are not seen through.

An electronic device 1 shown in FIGS. 1, 2, 3, and 4 is a device referred to as a control board, a mother board or the like which is used in electronic equipment such as a printer, an image scanner, or a mobile information terminal device and which is used to control operations of these devices. In FIGS. 1, 2, 3, and 4, the electronic device 1 is formed by mounting a control device (SOC) 2 such as a system-on-chip microcomputer for realizing a control function in accordance with a device to be controlled and "i (an integer greater than or equal to 2)×(a positive integer and j<=i)" memory devices, for example, eight memory devices (DRAM1 to DRAM8) 11 to 18, which are used as a work area of the control device 2 or a primary storage area of data, on a mounting substrate 3. Although details will be described later, j is the number of ranks and i is the number of memory devices that operate in the same rank. In the description below, the eight memory devices (DRAM1 to DRAM8) 11 to 18 operate as memory modules of two ranks. However, it is not limited to this. In the present embodiment, the number of memory devices is "i (an integer greater than or equal to 2)×j (a positive integer, j<=i, and j=2)". Therefore, the memory devices 11, 13, 15, and 17 are mounted, together with the control device 2, on the upper surface of the mounting substrate 3 and form one rank and the memory devices 12, 14, 16, and 18 are mounted on the lower surface of the mounting substrate 3 and form the other rank.

Although not shown in the drawings, it goes without saying that other semiconductor components may be mounted on the mounting substrate 3.

In the control device 2, although not particularly limited, a central processing unit, a memory controller, and other peripheral circuits are coupled to an internal bus and the central processing unit executes commands in accordance with a program to thereby perform device control. Although not particularly limited, the memory controller has a memory interface control function for a DDR3-SDRAM and a DDR2-SDRAM. Although not particularly limited, here, the memory devices 11 to 18 are constituted by mounting a semiconductor chip of DDR3-SDRAM on the memory devices. When targets to be accessed by the central processing unit are memory devices 11 to 18, the memory controller controls the memory devices 11 to 18 by generating an interface signal in the timing required for accessing the memory devices 11 to 18 in accordance with specifications of the DDR3-SDRAM according to an access address supplied from the internal bus.

The control device 2 and the memory devices 11 to 18 are coupled by a signal path constituted of wirings or the like formed of a plurality of layers on the mounting substrate 3. The signal path has a clock signal path CKL that supplies a clock signal (CK) to the memory devices 11 to 18 from the control device 2. The signal path has a command/address signal path CAL that supplies command (CMD)/address (ADR) signals to the memory devices 11 to 18 from the control device 2. The signal path has a data system signal path DTL that transfers data system signals such as data signals (DQ) and a data strobe signal (DQS) between the microcomputer 2 and the memory devices 11 to 18. The signal path has a control signal path CNTL for supplying control signals such as a chip selection signal (CS), a clock enable signal (CKE), and an on-die termination signal (ODT) to the memory devices 11 to 18 from the control device 2.

Here, the address signal (ADR) is a signal of a plurality of bits for specifying a memory cell to be accessed. A bank/address signal is address information for specifying a memory bank to be accessed. As a data system signal, the data signal (DQ) is data to be accessed. The data strobe signal (DQS) is a timing signal indicating data determination timing or the like in a data read operation (and a data write operation). The data system signals further include a data/mask signal (DM) that controls whether or not data can be written to a device.

The clock signal (CK) is a signal that determines timing serving as a reference of a memory operation, and for example, is a differential clock signal. The command (CMD) indicates a command depending on a combination of levels of strobe signals such as a row address strobe signal (RAS), a column address strobe signal (CAS), and a write enable signal. The clock signal (CK) is made active when the clock enable signal (CKE) is asserted, and data reading and writing of a DDR3-SDRAM from/to the outside are possible in synchronization with timing of rise and fall of the clock signal (CK). The address signal (ADR) is determined for each cycle of the clock signal (CK). A command input to the DDR3-SDRAM is enabled when a chip select signal (CS) is at an enable level, and a command (CMD) is indicated by a combination of levels of the signals RAS, CAS, and WE. The commands include an active command (ACT) which is a row address system command, a read command (RD) and a write command (WR) which are a column address system command, and the like. The active command is a command for activating the row address system by indicating a row address. The read command is a command to cause the column system to perform a read operation by indicating a column address after the row address system is activated. The write command is a command to cause the column system to perform a write operation by indicating a column address after the row address system is activated. The column system operation indicated by the write command and the read command is a burst access operation, and data corresponding to the number of bursts are sequentially read or written on the basis of an address indicated by the column address. The number of bursts of the DDR3-SDRAM is based on 8. It is not until an operation of a column system circuit reaches a predetermined state that first read data is determined by the column system operation indicated by the write command and the read command or write data first becomes able to be inputted. Such a delay time in the read operation is referred to as a read latency and such a delay time in the write operation is referred to as a write latency. The read latency and the write latency are determined as a time of a plurality of cycles of the clock signal (CK) in the circuit configuration. The on-die termination signal (ODT) is a signal that indicates whether or not a termination register arranged at a terminal of a data system wiring included in the DDR3-SDRAM is enabled, and is activated only for in-chip wirings of data system signals such as DQ and DQS.

The control device 2 divides the eight memory devices 11 to 18 into a first block (first rank) of the memory devices 11, 13, 15, and 17 mounted on the front surface of the mounting substrate 3 and a second block (second rank) of the memory devices 12, 14, 16, and 18 mounted on the back surface of the mounting substrate 3, and perform data input/output in a block unit. In short, the control device 2 controls the eight memory devices 11 to 18 as memory modules of two ranks (j=2). Although not particularly limited, each of the memory devices 11 to 18 performs input/output of data in a unit of 8 bits (1 byte) and the control device 2 assumes that four memory devices are one unit (i=4) and performs input/output of data in a unit of 32 bits for each rank.

A coupling form between the control device 2 and the eight memory devices 11 to 18 by the data system signal path DTL is individual coupling for each rank. That is, a first word CTdw1 of memory data terminals of the control device 2 is T-branched at intermediate branch points PSBd and is coupled to corresponding terminals MTd1 and MTd2 of the memory device 11 and the memory device 12. In the same manner, a second word CTdw2 of memory data terminals of the control device 2 is T-branched at intermediate branch points PSBd and is coupled to corresponding terminals MTd3 and MTd4 of the memory device 13 and the memory device 14, and a third word CTdw3 of memory data terminals of the control device 2 is T-branched at intermediate branch points PSBd and is coupled to corresponding terminals MTd5 and MTd6 of the memory device 15 and the memory device 16. Similarly, a fourth word CTdw4 of memory data terminals of the control device 2 is T-branched at intermediate branch points PSBd and is coupled to corresponding terminals MTd7 and MTd8 of the memory device 17 and the memory device 18.

A coupling form between the control device 2 and the eight memory devices 11 to 18 by the clock signal path CKL is a fly-by topology in which corresponding terminals of two memory devices are commonly coupled to one branch point PSBck. That is, clock input terminals MTck of the memory devices 11 and 12 are coupled to a first branch point PSBck from the upstream of the clock signal path CKL coupled to a clock output terminal CTck of the control device 2, clock input terminals MTck of the memory devices 13 and 14 are coupled to the next branch point PSBck, clock input terminals MTck of the memory devices 15 and 16 are coupled to the next branch point PSBck, and clock input terminals MTck of the memory devices 17 and 18 are coupled to the last branch point PSBck.

A coupling form between the control device 2 and the eight memory devices 11 to 18 by the command/address signal path CAL is a fly-by topology in which corresponding terminals of two memory devices are commonly coupled to one branch point PSBcan or PSBcaf. That is, command/address input terminals MTca of the memory devices 11 and 12 are coupled to a first branch point PSBcan or PSBcaf from the upstream of the command/address signal path CAL coupled to command/address output terminals CTca of the control device 2. Command/address input terminals MTca of the memory devices 13 and 14 are coupled to the next branch point PSBcan or PSBcaf. Command/address input terminals MTca of the memory devices 15 and 16 are coupled to the next branch point PSBcan or PSBcaf. Command/ address input terminals MTca of the memory devices 17 and 18 are coupled to the last branch point PSBcan or PSBcaf.

A coupling form between the control device 2 and the eight memory devices 11 to 18 by the control signal path CNTL is a fly-by topology in which corresponding terminals of the memory devices are commonly coupled for each rank. That is, control signal input terminals MTcnt of the memory devices 11, 13, 15, and 17 are sequentially coupled to branch points PSBcnt of the control signal path CNTL from the upstream of the control signal path CNTL coupled to a control output terminal CTcnt for the first rank of the control device 2. On the other hand, control signal input terminals MTcnt of the memory devices 12, 14, 16, and 18 are sequentially coupled to branch points PSBcnt of the control signal path CNTL from the upstream of the control signal path CNTL coupled to a control output terminal CTcnt for the second rank of the control device 2.

Over the mounting substrate 3, a differential termination resistor RD_CK is coupled to a terminal of the differential clock signal path CKL, a termination resistor RT_CA is coupled to a terminal of the command/address signal path CAL, and a termination resistor RT_CNT is coupled to a terminal of the control signal path CNTL. Regarding the data system signal path DTL, through the use of an on-die termination function of the memory devices 11 to 18, no external termination resistor is coupled. A chip resistor is used as each of the differential termination resistor RD_CK, the termination resistor RT_CNT, and the termination resistor RT_CA.

Over the mounting substrate 3, some branch points PSBcan of the command/address signal path CAL are arranged at overlapping positions in the front-back direction of the memory devices 11 to 18. On the other hand, the other some branch points PSBcaf of the command/address signal path CAL are arranged at positions not overlapping each other but being spaced apart from each other in the front-back direction of the memory devices 11 to 18. When a branch point PSBcaf is formed at a position being spaced apart from the memory devices 11 to 18, a branch path from the branch point PSBcaf to a corresponding terminal of the memory devices 11 to 18 becomes long. In the fly-by topology, a branch point generates discontinuity in an impedance state and serves as a load degrading a signal, and thus it is desirable to shorten the branch path as much as possible in order to suppress signal distortion. When a path length is longer than other paths just like the branch path from the branch point PSBcaf to a corresponding terminal of the memory devices 11 to 18, a stub resistor RS_CA is coupled to the midway of the branch path. A chip resistor is used as the stub resistor RS_CA. When the branch points in the fly-by topology do not overlap each other in the front-back direction of the memory device, the branch path is determined to be long as a determination method whether the branch path is long or short, and the stub resistor RS_CA is inserted.

Figure 5:
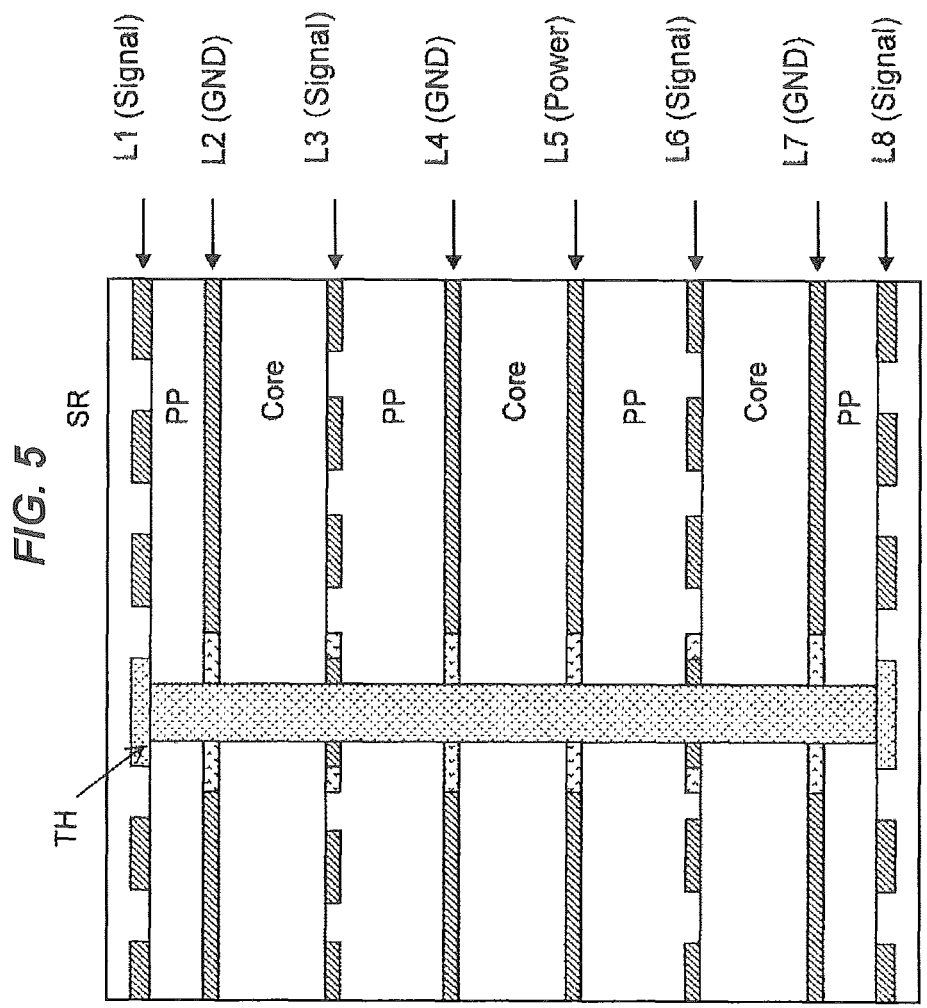
FIG. 5 is a schematic cross-sectional view illustrating a vertical cross-sectional structure of a mounting substrate.

FIG. 5 illustrates a vertical cross-sectional structure of the mounting substrate 3. As illustrated in FIG. 5, the mounting substrate is an eight-layer substrate and includes eight wiring layers L1 to L8. Core is a core layer. PP is a prepreg layer that serves as an adhesive. SR is a surface protective layer. L1, L3, L6, and L8 are used as signal wirings, L2, L4, and L7 are used as a ground pattern or the like, and L5 is used as a power supply pattern or the like. TH indicates an example of a penetrating through-hole used to couple wirings between layers.

Figure 6:
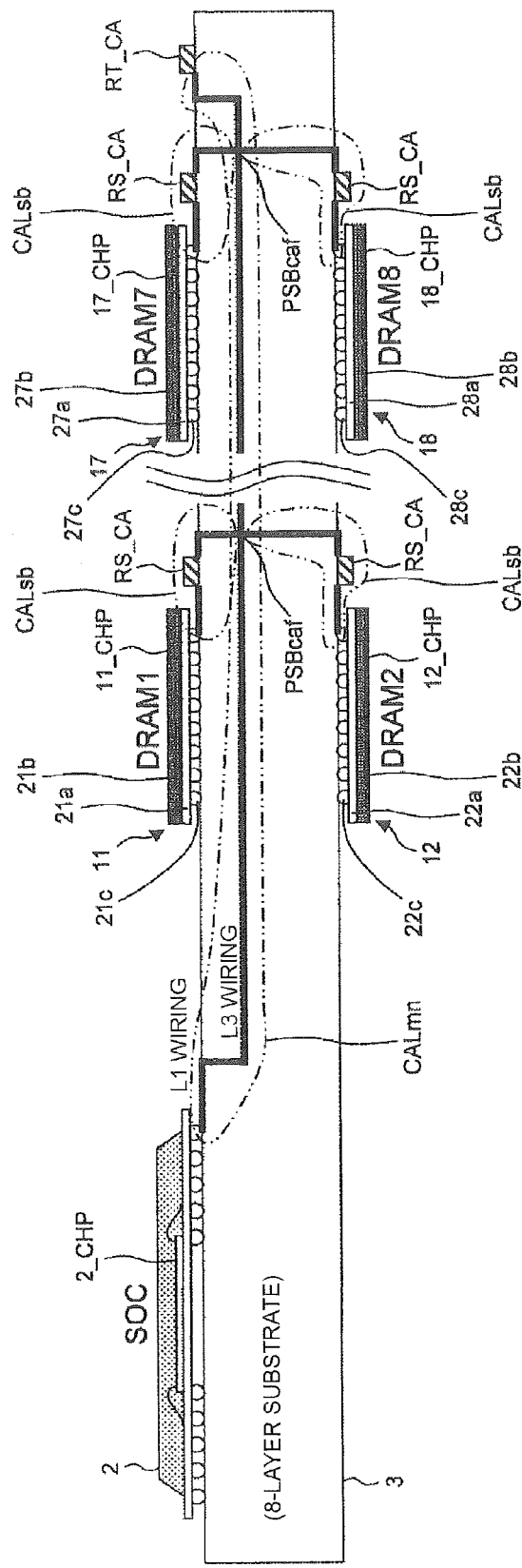
FIG. 6 is a cross-sectional view schematically showing a vertical cross-sectional structure of a one-bit signal path of a command/address signal path CAL in the electronic device.

FIG. 6 schematically shows a vertical cross-sectional structure of a one-bit signal path of the command/address signal path CAL in the electronic device 1. In FIG. 6, in the one-bit signal path of the command/address signal path CAL, a fly-by topology is formed by a command/address signal main wiring CALmn extending from the command/ address output terminal CTca of the control device 2 to the termination resistor RT_CA via an L1 layer wiring and an L3 layer wiring and by a branch wiring CALsb extending from the branch point PSBcaf of the command/address signal main wiring CALmn to the command/address input terminal MTca of each of the memory devices 11 to 18. Here, for example, a coupling portion between the penetrating through-hole TH shown in FIG. 5 and the L3 layer wiring corresponds to the branch point PSBcaf. Therefore, the branch point PSBcaf requires a relatively large area corresponding to a diameter (for example, 0.3 mm) of a drill that forms the penetrating through-hole TH. Meanwhile, in FIG. 6, 2_CHP is a controller chip, which is a semiconductor integrated circuit chip included in the control device 2. 11_CHP to 18_CHP are memory chips (DDR3-SDRAM chips), which are semiconductor integrated circuit chips included in the memory devices 11 to 18.

Figure 7:
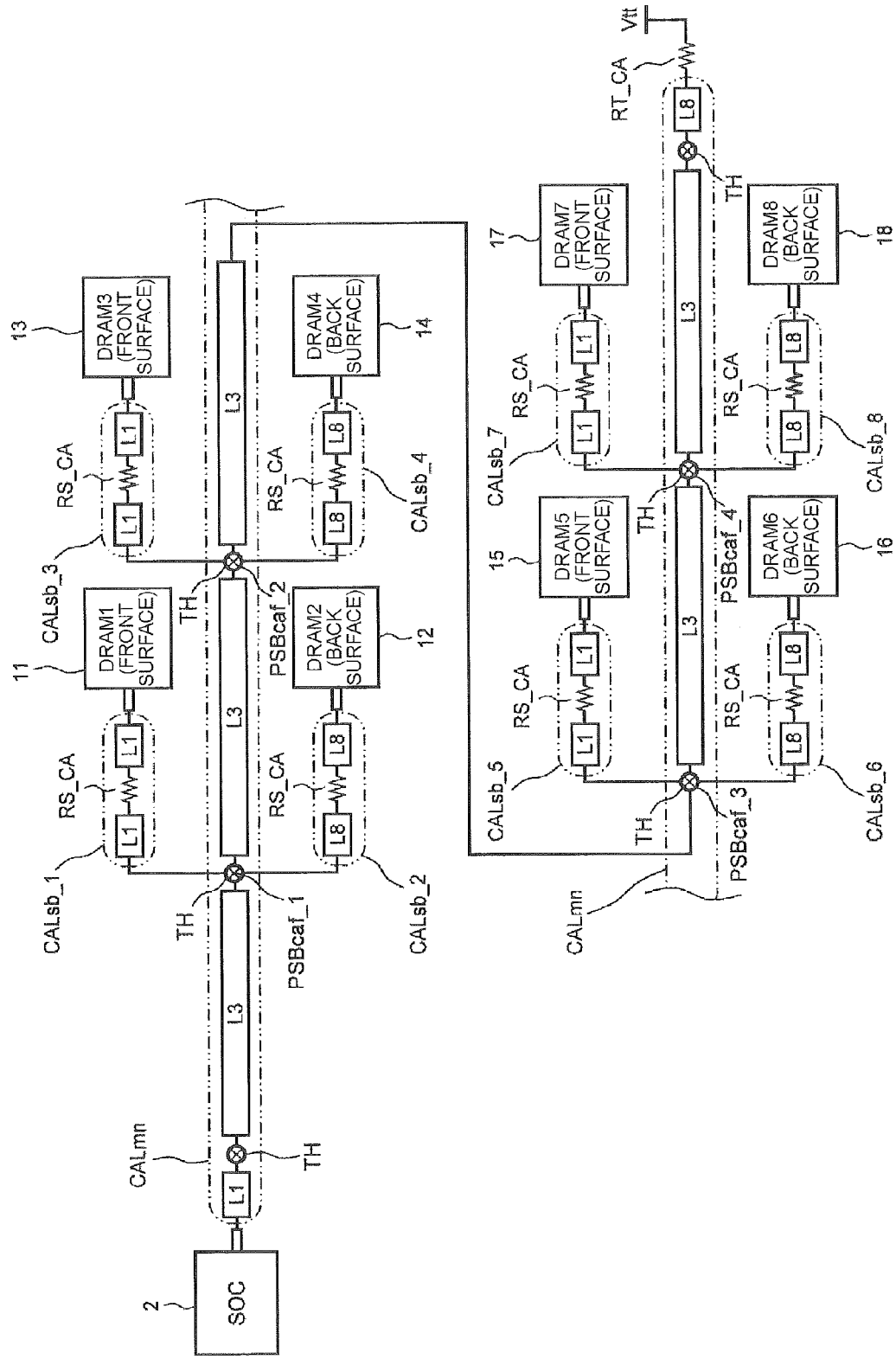
FIG. 7 is an explanatory diagram illustrating details of a fly-by topology of a command/address signal path having a branch point PSBcaf.

FIG. 7 illustrates details of the fly-by topology of the command/address signal path having the branch points PSBcaf. Here, the eight-layer substrate in FIG. 5 is used as an example. The command/address signal main wiring CALmn includes, from the side of the control device 2, an L1 layer wiring, a through-hole TH, an L3 layer wiring, a through-hole TH, an L3 layer wiring, a through-hole TH, an L3 layer wiring, a through-hole TH, an L3 layer wiring, a through-hole TH, an L3 layer wiring, a through-hole TH, and an L8 layer wiring. In the midway of the command/ address signal main wiring CALmn, the branch points PSBcaf_1, PSBcaf_2, PSBcaf_3, and PSBcaf_4 are formed, and command/address signal branch wirings CALsb_1 and CALsb_2 extending from the branch point PSBcaf_1 to the memory devices 11 and 12 are formed. Command/address signal branch wirings CALsb_3 and CALsb_4 extending from the branch point PSBcaf_2 to the memory devices 13 and 14 are formed. Command/address signal branch wirings CALsb_5 and CALsb_6 extending from the branch point PSBcaf_3 to the memory devices 15 and 16 are formed. Command/address signal branch wirings CALsb_7 and CALsb_8 extending from the branch point PSBcaf_4 to the memory devices 17 and 18 are formed.

The L1 layer wirings are used for the command/address signal branch wirings CALsb_1, CALsb_3, CALsb_5, and CALsb_7, and the stub resistor RS_CA is coupled in series to the midway of each of the command/address signal branch wirings CALsb_1, CALsb_3, CALsb_5, and CALsb_7.

The L8 layer wirings are used as the command/address signal branch wirings CALsb_2, CALsb_4, CALsb_6, and CALsb_8, and the stub resistor RS_CA is coupled in series to the midway of each of the command/address signal branch wirings CALsb_2, CALsb_4, CALsb_6, and CALsb_8.

Meanwhile, although details of a fly-by topology of a command/address signal path that has no branch point PSBcaf are not shown in the drawings, in such a flay-by topology, no stub resistor RS_CA is arranged as compared with FIG. 7. This is because the branch points PSBcan are arranged at positions overlapping each other in the front-back direction of corresponding memory devices as illustrated in FIG. 1 and the branch wirings branched from the branch points PSBcan are not undesirably long.

Figure 8:
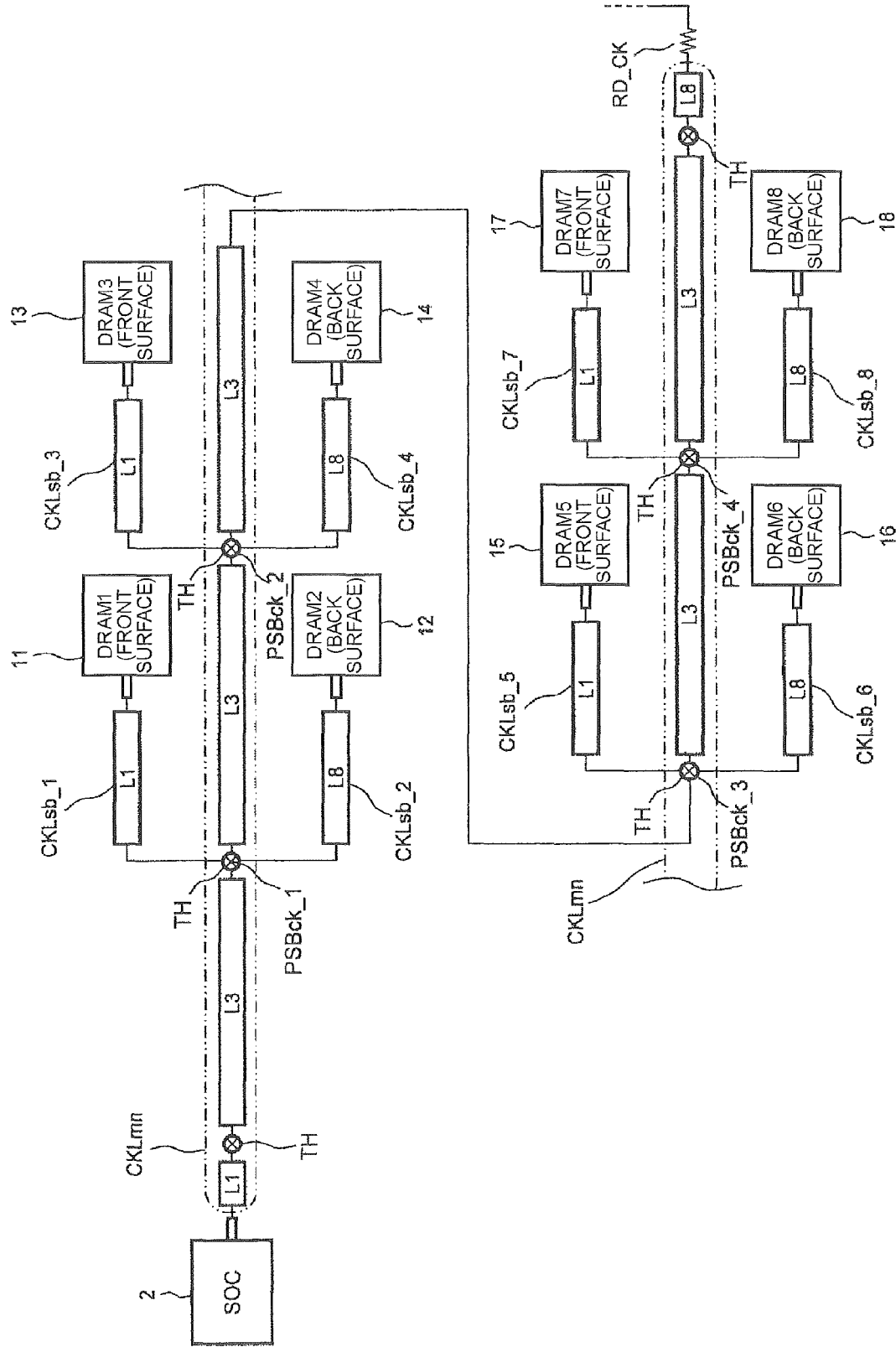
FIG. 8 is an explanatory diagram illustrating details of the fly-by topology of a clock signal path.

FIG. 8 illustrates details of the fly-by topology of the clock signal path. FIG. 8 shows either one of a reverse path and a non-reverse path of the differential clock signal path and the other path is omitted from FIG. 8. Here, the eight-layer substrate in FIG. 5 is used as an example. The clock signal main wiring CKLmn includes, from the side of the control device 2, an L1 layer wiring, a through-hole TH, an L3 layer wiring, a through-hole TH, an L3 layer wiring, a through-hole TH, an L3 layer wiring, a through-hole TH, an L3 layer wiring, a through-hole TH, an L3 layer wiring, a through-hole TH, and an L8 layer wiring. In the midway of the clock signal main wiring CKLmn, the branch points PSBck_1, PSBck_2, PSBck_3, and PSBck_4 are formed and clock signal branch wirings CKLsb_1 and CKLsb_2 extending from the branch point PSBck_1 to the memory devices 11 and 12 are formed. Clock signal branch wirings CKLsb_3 and CKLsb_4 extending from the branch point PSBck_2 to the memory devices 13 and 14 are formed. Clock signal branch wirings CKLsb_5 and CKLsb_6 extending from the branch point PSBck_3 to the memory devices 15 and 16 are formed. Clock signal branch wirings CKLsb_7 and CKLsb_8 extending from the branch point PSBck_4 to the memory devices 17 and 18 are formed.

The L1 layer wirings are used as the clock signal branch wirings CKLsb_1, CKLsb_3, CKLsb_5, and CKLsb_7, and no stub resistor is inserted in the midway of each of the clock signal branch wirings CKLsb_1, CKLsb_3, CKLsb_5, and CKLsb_7. The L8 layer wirings are used as the clock signal branch wirings CKLsb_2, CKLsb_4, CKLsb_6, and CKLsb_8, and no stub resistor is inserted in the midway of each of the clock signal branch wirings CKLsb_2, CKLsb_4, CKLsb_6, and CKLsb_8. This is because the branch points PSBck are arranged at positions overlapping each other in the front-back direction of corresponding memory devices as illustrated in FIG. 1 and the branch wirings branched from the branch points PSBck are not undesirably long.

Figure 9:
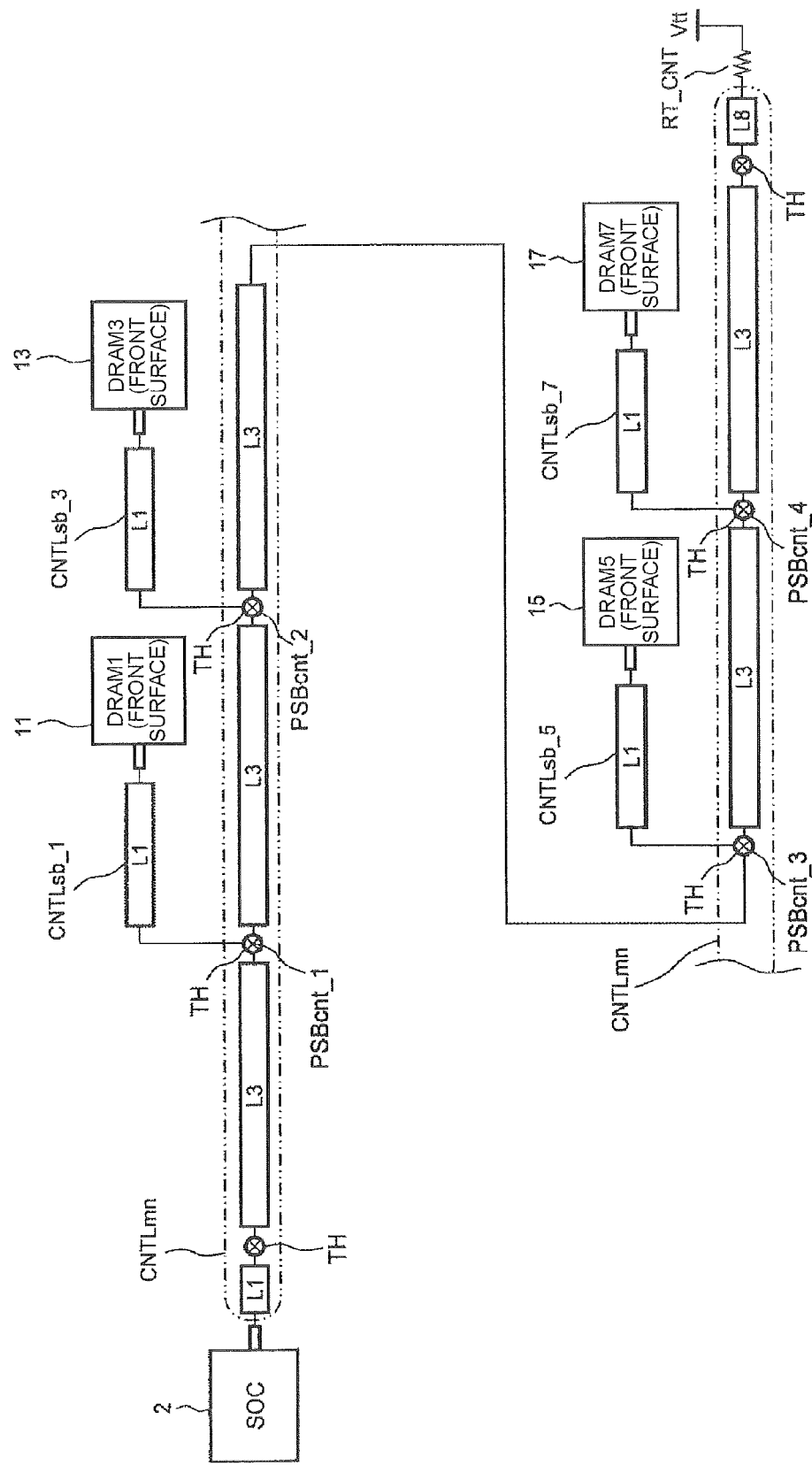
FIG. 9 is an explanatory diagram illustrating details of the fly-by topology of a first rank control signal path.

FIG. 9 illustrates details of the fly-by topology of the control signal path of the first rank. The control signal path is individualized for each rank, and thus memory control is possible in units of four memory devices of each rank. Here, the eight-layer substrate in FIG. 5 is used as an example. The control signal main wiring CNTLmn includes, from the side of the control device 2, an L1 layer wiring, a through-hole TH, an L3 layer wiring, a through-hole TH, an L3 layer wiring, a through-hole TH, an L3 layer wiring, a through-hole TH, an L3 layer wiring, a through-hole TH, an L3 layer wiring, a through-hole TH, and an L8 layer wiring. In the midway of the control signal main wiring CNTLmn, the branch points PSBcnt_1, PSBcnt_2, PSBcnt_3, and PSBcnt_4 are formed and a control signal branch wiring CNTLsb_1 extending from the branch point PSBcnt_1 to the memory device 11 is formed. A control signal branch wiring CNTLsb_3 extending from the branch point PSBcnt_2 to the memory device 13 is formed. A control signal branch wiring CNTLsb_5 extending from the branch point PSBCnt_3 to the memory device 15 is formed. A control signal branch wiring CNTLsb_7 extending from the branch point PSBcnt_4 to the memory device 17 is formed.

The L1 layer wirings are used as the control signal branch wirings CNTLsb_1, CNTLsb_3, CNTLsb_5, and CNTLsb_7, and no stub resistor is inserted in the midway of each of the control signal branch wirings CNTLsb_1, CNTLsb_3, CNTLsb_5, and CNTLsb_7. This is because the branch points PSBcnt are arranged at positions overlapping each other in the front-back direction of corresponding memory devices as illustrated in FIG. 1 and the branch wirings branched from the branch points PSBcnt are not undesirably long.

Meanwhile, details of the fly-by topology of a second rank control signal path is substantially the same as those shown in FIG. 9, and a difference is only that the L8 layer wirings are used as the control signal branch wirings CNTLsb_2, CNTLsb_4, CNTLsb_6, and CNTLsb_8, and thus the details are not shown in the drawings.

Figure 10:
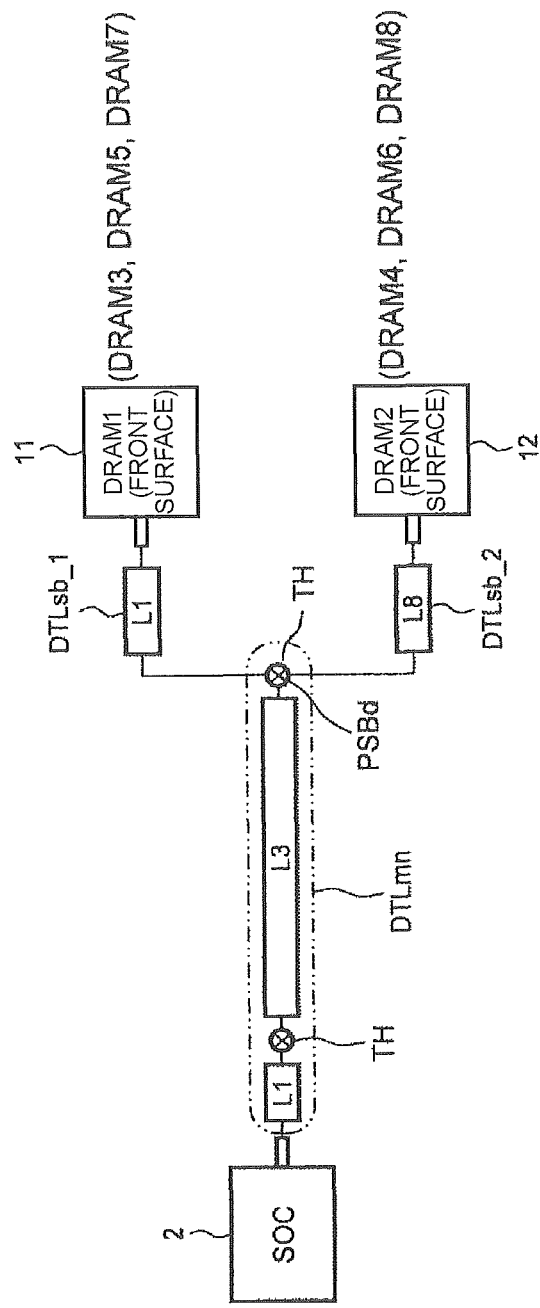
FIG. 10 is an explanatory diagram illustrating details of a T-junction topology of a data system signal path.

FIG. 10 illustrates details of the T-branch fly-by topology of the data system signal path. The data system signal path is individualized for each pair of a pair of the memory device 11 and the memory device 12, a pair of the memory device 13 and the memory device 14, a pair of the memory device 15 and the memory device 16, and a pair of the memory device 17 and the memory device 18. According to FIG. 10 that focuses attention on the pair of the memory device 11 and the memory device 12, the data system signal path includes the data system signal main wiring DTLmn which is individual for each memory device in the same rank and is commonly provided for each corresponding memory device between the two ranks (j=2), and two (j=2) data system signal branch wirings DTLsb_1 and DTLsb_2 which are branched from the data system signal main wiring DTLmn at a data system signal branch point PSBd. The same applies to the other pairs of the memory devices.

Also in FIG. 10, the eight-layer substrate in FIG. 5 is used as an example. The data system signal main wiring DTLmn includes, from the side of the control device 2, an L1 layer wiring, a through-hole TH, an L3 layer wiring, and a through-hole TH. In the midway of the data system signal main wiring DTLmn, the branch point PSBd is formed, and the data system signal branch wiring DTLsb_1 extending from the branch point PSBd to the memory device 11 is formed by the through-hole TH and the L1 layer wiring. The data system signal branch wiring DTLsb_2 extending from the branch point PSBd to the memory device 12 is formed by the through-hole TH and the L8 layer wiring. Data system terminals of the memory devices 11 to 18 have the on-die termination function, and thus that neither a termination resistor nor a stub resistor is required.

Figure 11:
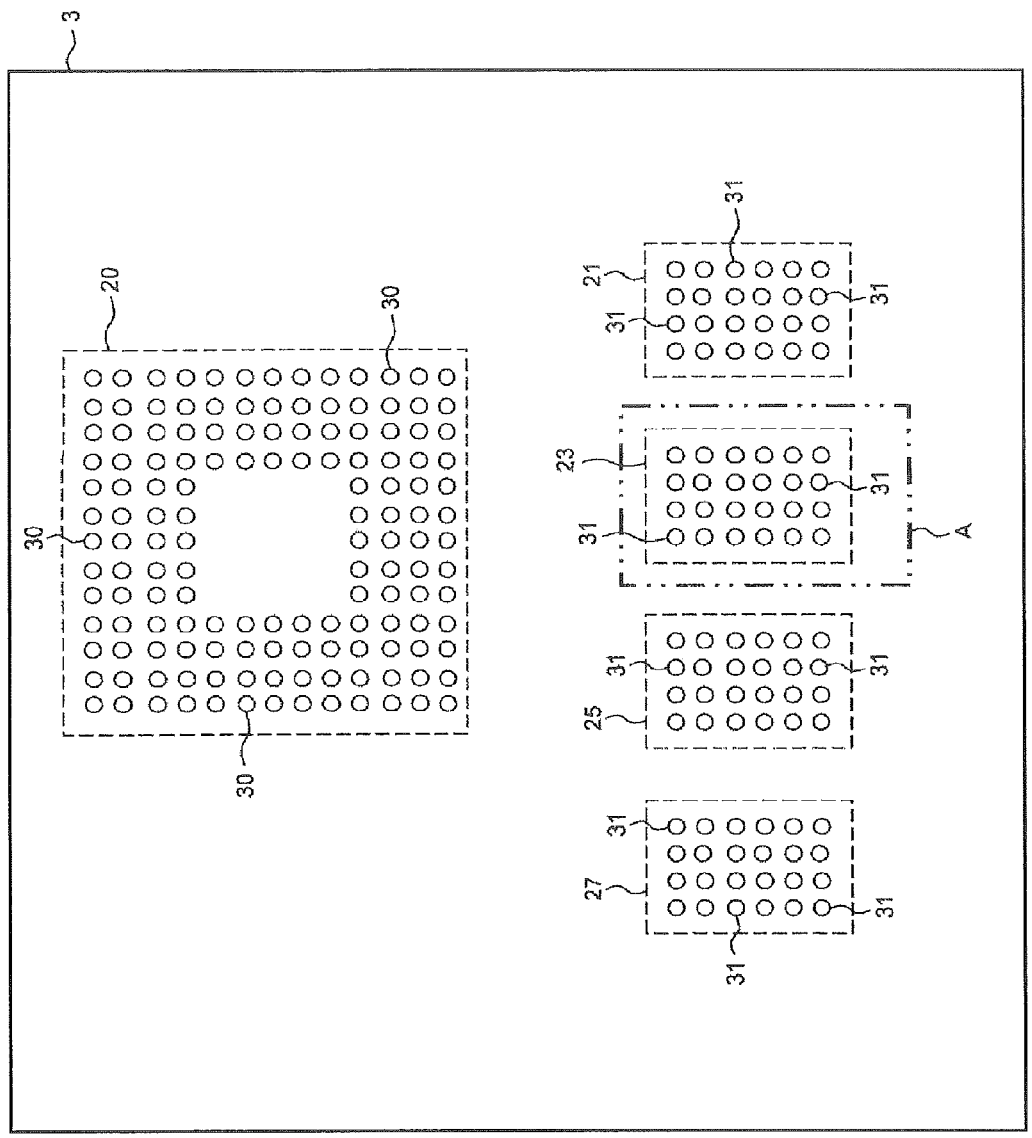
FIG. 11 is an explanatory diagram illustrating mounting areas of semiconductor components formed on a front surface of a mounting substrate 3.
Figure 12:
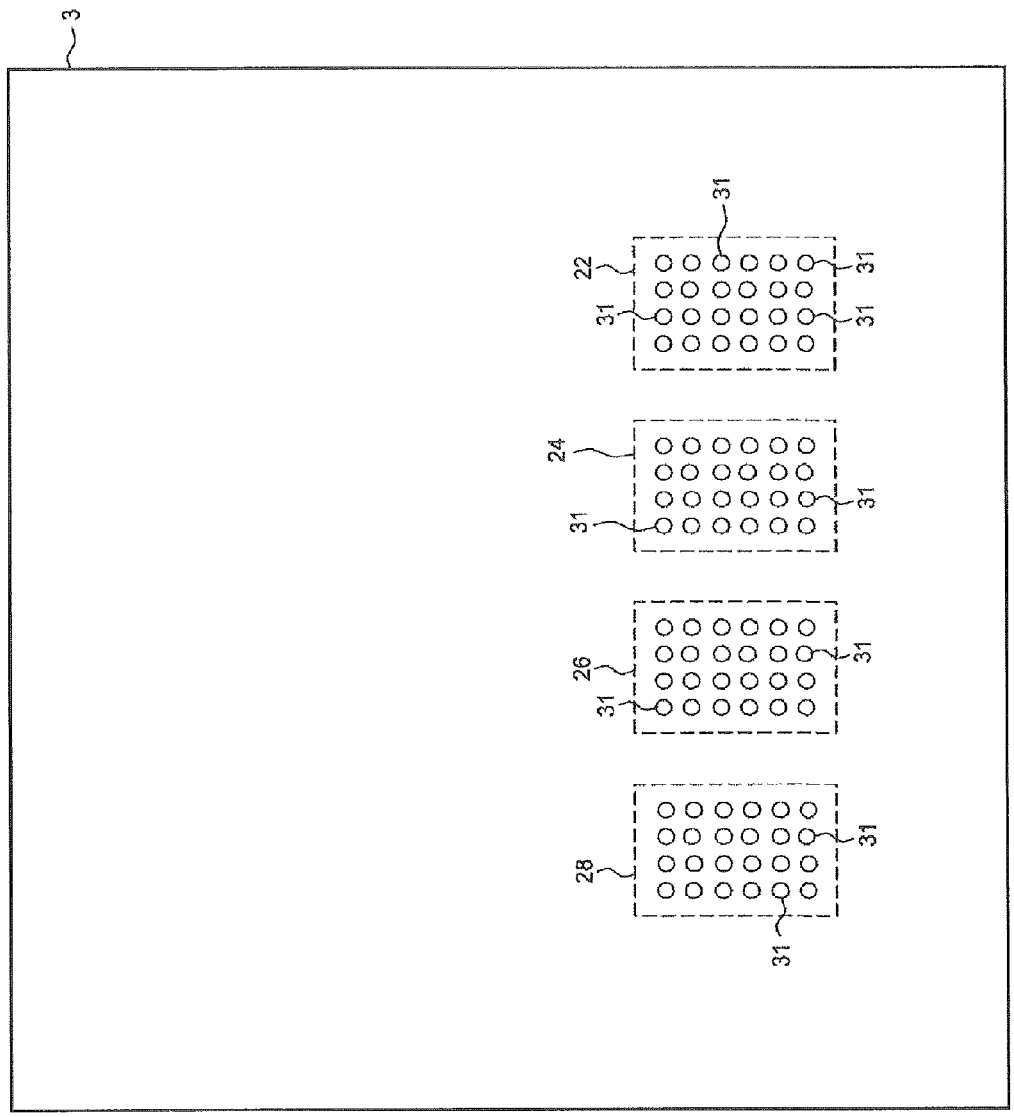
FIG. 12 is an explanatory diagram illustrating mounting areas of semiconductor components formed on a back surface of the mounting substrate 3.

FIG. 11 illustrates mounting areas of the semiconductor components formed on the front surface of the mounting substrate 3. FIG. 12 illustrates mounting areas of the semiconductor components formed on the back surface of the mounting substrate 3.

In FIGS. 11 and 12, reference numeral 20 denotes a mounting area of the control device 2 and reference numerals 21 to 28 denote mounting areas of the memory devices 11 to 18. In the mounting area 20 of the control device 2, electrode pads (electrode lands) 30, where external terminals (for example, solder bump electrodes) such as the memory data terminals CTdw1 to CTdw4 of the control device 2, the clock output terminal CTck, a command/address signal output terminal CTca, and a control signal output terminal CTcnt are mounted, are formed on the surface.

In the mounting areas 21 to 28 of the memory devices 11 to 18, electrode pads (electrode lands) 31, where external terminals (for example, solder bump electrodes) such as the clock input terminal MTck, the command/address input terminals MTca, and the control signal input terminal MTcnt are mounted, are formed on the surface.

Meanwhile, although FIGS. 1 and 2 show a part of the external terminals of the control device 2 and apart of the external terminals of the memory devices 11 to 18 and the other external terminals are omitted, in the control device 2, in the same manner as the arrangement of the electrode pads 30 in the mounting area of the control device 2 in FIG. 11, the external terminals are concentrically arranged in a plurality of rows from the outer circumference of the control device 2. In addition, the external terminals of the memory devices 11 to 18 are also arranged in a plurality of rows in the back surface in the same manner as the arrangement of the electrode pads 31 in the mounting areas 21 to 28.

Figure 13:
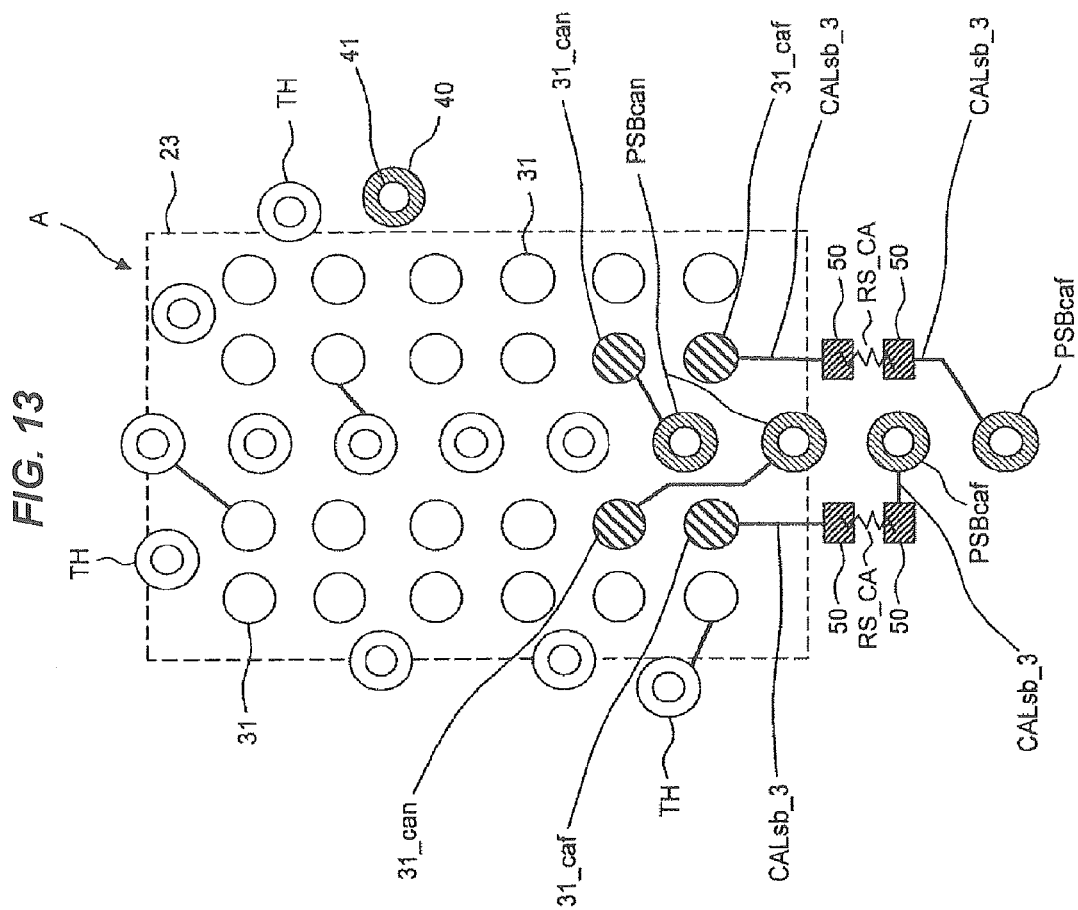
FIG. 13 is an explanatory diagram illustrating details of a portion A in FIG. 11 as a vicinity of a mounting area of a memory device.

FIG. 13 illustrates details of a portion A in FIG. 11 as a vicinity of amounting area of a memory device. In FIG. 13, a single circle indicates an electrode pad 31 and a double circle indicates a through-hole TH. A conductive material 41 is flown into the periphery of a drill hole 40, and thus the through-hole TH forms a wiring path. Reference symbol 31_can denotes an electrode pad coupled to the branch point PSBcan and reference symbol 31_caf denotes an electrode pad coupled to the branch point PSBcaf. The distance from the electrode pad 31_caf to the branch point PSBcaf is made longer than the distance from the electrode pad 31_can to the branch point PSBcan, and thus the stub resistor RS_CA is coupled in series via electrode pads 50 to the midway of the command/address signal branch wiring CALsb_3 that couples the electrode pad 31_caf to the branch point PSBcaf. Although not shown in the drawings, the same applies to the other memory devices 11, 12, and 14 to 18.

Here, the control device 2 and the memory devices 11 to 18 are constituted by packaging a chip of a semiconductor integrated circuit (a semiconductor chip) as shown in FIG. 6. The control device 2 has a controller chip 2_CHP such as a microcomputer chip, the controller chip 2_CHP is packaged and electrodes of the controller chip 2_CHP are coupled to external terminals of the package, and thus the control device 2 is formed. As to each of the memory devices 11 to 18, DDR3-SDRAM chips 11_CHP to 18_CHP are individually packaged and electrodes of the DDR3-SDRAM chips 11_CHP to 18_CHP are coupled to external terminals of the package, and thus the memory devices 11 to 18 are formed.

The configuration of the electronic device (electronic equipment, module product) of the present embodiment will be restated below on the basis of the above description.

As shown in FIGS. 1 to 4 and 6, the electronic device (electronic equipment, module product) 1 includes the mounting substrate (mother board, module substrate) 3, the memory devices (semiconductor components, semiconductor devices, DRAMs) 11, 12, 13, 14, 15, 16, 17, and 18, which are mounted on the upper surface (front surface) of the mounting substrate 3, and the control device (semiconductor component, semiconductor device, logic device, SOC) 2 which is mounted on the upper surface (front surface) of the mounting substrate 3 and controls the memory devices 11 to 18.

Furthermore, the mounting substrate 3 has the upper surface (front surface) and the lower surface (back surface) opposite to the upper surface. In addition, as shown in FIG. 11, the mounting substrate 3 includes a plurality of lands (electrode pads) 31 provided in a memory device mounting area (semiconductor component mounting area) 21 on the upper surface. Moreover, as shown in FIG. 12, the mounting substrate 3 includes a plurality of lands (electrode pads) 31 provided in a memory device mounting area (semiconductor component mounting area) 22 which is on the lower surface and overlaps the memory device mounting area 21 in the thickness direction of the mounting substrate 3. In addition, as shown in FIG. 11, the mounting substrate 3 includes a plurality of lands (electrode pads) 31 provided in a memory device mounting area (semiconductor component mounting area) 23 which is on the upper surface and located next to the memory device mounting area 21. Furthermore, as shown in FIG. 12, the mounting substrate 3 includes a plurality of lands (electrode pads) 31 provided in a memory device mounting area (semiconductor component mounting area) 24 which is on the lower surface, overlaps the memory device mounting area 23 in the thickness direction of the mounting substrate 3, and is located next to the memory device mounting area 22. Moreover, as shown in FIG. 11, the mounting substrate 3 includes a plurality of lands (electrode pads) 31 provided in a memory device mounting area (semiconductor component mounting area) 25 which is in the upper surface and located next to the memory device mounting area 23. In addition, as shown in FIG. 12, the mounting substrate 3 includes a plurality of lands (electrode pads) 31 provided in a memory device mounting area (semiconductor component mounting area) 26 which is on the lower surface, overlaps the memory device mounting area 25 in the thickness direction of the mounting substrate 3, and is located next to the memory device mounting area 24. Furthermore, as shown in FIG. 11, the mounting substrate 3 includes a plurality of lands (electrode pads) 31 provided in a memory device mounting area (semiconductor component mounting area) 27 which is on the upper surface and located next to the memory device mounting area 25. Moreover, as shown in FIG. 12, the mounting substrate 3 includes a plurality of lands (electrode pads) 31 provided in a memory device mounting area (semiconductor component mounting area) 28 which is in the lower surface, overlaps the memory device mounting area 27 in the thickness direction of the mounting substrate 3, and is located next to the memory device mounting area 26. In addition, as shown in FIG. 11, the mounting substrate 3 includes a plurality of lands (electrode pads) 30 provided in a control device mounting area (semiconductor component mounting area, logic device mounting area) 20 which is on the upper surface and located next to the memory device mounting areas 21, 23, 25, and 27.

Furthermore, as shown in FIGS. 1, 3, 6, and 11, the memory device 11 includes an interposer (wiring substrate) 21a, a memory chip (semiconductor chip) which is mounted over the interposer 21a, operates in synchronization with the clock signal, and is not shown in the drawings, a sealing body (resin) 21b that seals the memory chip, and a plurality of solder balls (external terminals) 21c electrically coupled to the memory chip. In addition, the memory device 11 is mounted on the memory device mounting area 21 on the upper surface of the mounting substrate 3 and the solder balls 21c are electrically coupled to the lands 31 provided in the memory device mounting area 21, respectively.

Moreover, as shown in FIGS. 2, 4, 6, and 11, the memory device 12 includes an interposer (wiring substrate) 22a, a memory chip (semiconductor chip) which is mounted over the interposer 22a, operates in synchronization with the clock signal, and is not shown in the drawings, a sealing body (resin) 22b that seals the memory chip, and a plurality of solder balls (external terminals) 22c electrically coupled to the memory chip. In addition, the memory device 12 is mounted on the memory device mounting area 22 on the lower surface of the mounting substrate 3 and the solder balls 22c are electrically coupled to the lands 31 provided in the memory device mounting area 22, respectively.

Furthermore, as shown in FIGS. 1, 3, 6, and 11, the memory device 13 includes an interposer (wiring substrate) 23a, a memory chip (semiconductor chip) which is mounted over the interposer 23a, operates in synchronization with the clock signal, and is not shown in the drawings, a sealing body (resin) 23b that seals the memory chip, and a plurality of solder balls (external terminals) 23c electrically coupled to the memory chip. In addition, the memory device 13 is mounted on the memory device mounting area 23 on the upper surface of the mounting substrate 3 and the solder balls 23c are electrically coupled to the lands 31 provided in the memory device mounting area 23, respectively.

Moreover, as shown in FIGS. 2, 4, 6, and 11, the memory device 14 includes an interposer (wiring substrate) 24a, a memory chip (semiconductor chip) which is mounted over the interposer 24a, operates in synchronization with the clock signal, and is not shown in the drawings, a sealing body (resin) 24b that seals the memory chip, and a plurality of solder balls (external terminals) 24c electrically coupled to the memory chip. In addition, the memory device 14 is mounted on the memory device mounting area 24 on the lower surface of the mounting substrate 3 and the solder balls 24c are electrically coupled to the lands 31 provided in the memory device mounting area 24, respectively.

Furthermore, as shown in FIGS. 1, 3, 6, and 11, the memory device 15 includes an interposer (wiring substrate) 25a, a memory chip (semiconductor chip) which is mounted over the interposer 25a, operates in synchronization with the clock signal, and is not shown in the drawings, a sealing body (resin) 25b that seals the memory chip, and a plurality of solder balls (external terminals) 25c electrically coupled to the memory chip. In addition, the memory device 15 is mounted on the memory device mounting area 25 on the upper surface of the mounting substrate 3 and the solder balls 25c are electrically coupled to the lands 31 provided in the memory device mounting area 25, respectively.

Moreover, as shown in FIGS. 2, 4, 6, and 11, the memory device 16 includes an interposer (wiring substrate) 26a, a memory chip (semiconductor chip) which is mounted over the interposer 26a, operates in synchronization with the clock signal, and is not shown in the drawings, a sealing body (resin) 26b that seals the memory chip, and a plurality of solder balls (external terminals) 26c electrically coupled to the memory chip. In addition, the memory device 16 is mounted on the memory device mounting area 26 on the lower surface of the mounting substrate 3 and the solder balls 26c are electrically coupled to the lands 31 provided in the memory device mounting area 26, respectively.

Furthermore, as shown in FIGS. 1, 3, 6, and 11, the memory device 17 includes an interposer (wiring substrate) 27a, a memory chip (semiconductor chip) which is mounted over the interposer 27a, operates in synchronization with the clock signal, and is not shown in the drawings, a sealing body (resin) 27b that seals the memory chip, and a plurality of solder balls (external terminals) 27c electrically coupled to the memory chip. In addition, the memory device 17 is mounted on the memory device mounting area 27 on the upper surface of the mounting substrate 3 and the solder balls 27c are electrically coupled to the lands 31 provided in the memory device mounting area 27, respectively.

Moreover, as shown in FIGS. 2, 4, 6, and 11, the memory device 18 includes an interposer (wiring substrate) 28a, a memory chip (semiconductor chip) which is mounted over the interposer 28a, operates in synchronization with the clock signal, and is not shown in the drawings, a sealing body (resin) 28b that seals the memory chip, and a plurality of solder balls (external terminals) 28c electrically coupled to the memory chip. In addition, the memory device 18 is mounted on the memory device mounting area 28 on the lower surface of the mounting substrate 3 and the solder balls 28c are electrically coupled to the lands 31 provided in the memory device mounting area 28, respectively.

Furthermore, as shown in FIGS. 1, 3, 6, 11, and 15, the control device 2 includes an interposer (wiring substrate) 100, a control chip (semiconductor chip, logic chip) 2_CHP which is mounted over the interposer 100 and controls the memory devices 11 to 18, a sealing body (resin) 106 that seals the control chip 2_CHP, and a plurality of solder balls (external terminals) 107 electrically coupled to the control chip 2_CHP. In addition, the control device 2 is mounted on the control device mounting area 20 on the upper surface of the mounting substrate 3 and the solder balls 107 are electrically coupled to the plurality of lands 30 provided in the control device mounting area 20, respectively.

As shown in FIGS. 1, 2, and 6, a command/address signal pad (a pad to which the command/address output terminal CTca of the control device 2 is coupled) among the lands 30 is electrically coupled to command/address signal pads (pads to which the command/address input terminals MTca of the memory devices 11 to 18 are coupled) 31_can or 31_caf among the lands 31 provided in the memory device mounting areas 21 to 28 via a command/address signal main wiring (a main wiring) CALmn among a plurality of wirings provided at the mounting substrate 3 and command/address branch wirings (stub wirings) CALsb branched from the command/address signal main wiring CALmn at the branch points PSBcan or PSBcaf of the command/address signal main wiring CALmn.

Here, as shown in FIG. 13, the branch point PSBcan is arranged inside each semiconductor component mounting area (the control device mounting area 20, the memory device mounting areas 21 to 28), that is to say, arranged at a position overlapping each semiconductor component (the control device 2, the memory devices 11 to 18), in the mounting substrate 3. On the other hand, as shown in FIG. 13, the branch point PSBcaf is arranged outside each semiconductor component mounting area (the control device mounting area 20, the memory device mounting areas 21 to 28), that is to say, arranged at a position that does not overlap each semiconductor component (the control device 2, the memory devices 11 to 18), in the mounting substrate 3.

Furthermore, the transmission (transfer) of the command/address signal is performed in one direction going from the control device 2 to each memory device 11 to 18 via the command/address signal main wiring CALmn. The transmission of the clock signal and the control signal is also the same as that of the command/address signal. On the other hand, the transmission of the data signal is performed in two directions going from the control device 2 to each memory device 11 to 18 and from each memory device 11 to 18 to the control device 2.

Moreover, each command/address signal pad (each pad to which the command/address input terminal MTca of the memory devices 11 to 18 is coupled) 31_can and 31_caf which is electrically coupled to each memory device 11 to 18 is coupled to the command/address signal main wiring CALmn in the fly-by mode.

In addition, the chip resistor RS_CA is coupled (mounted) in series to each command/address branch wiring (stub wiring) CALsb.

Control Device (Semiconductor Component, Semiconductor Device, Logic Device, SOC)

Next, the configuration of the control device 2 used in the present embodiment will be described below.

Figure 14:
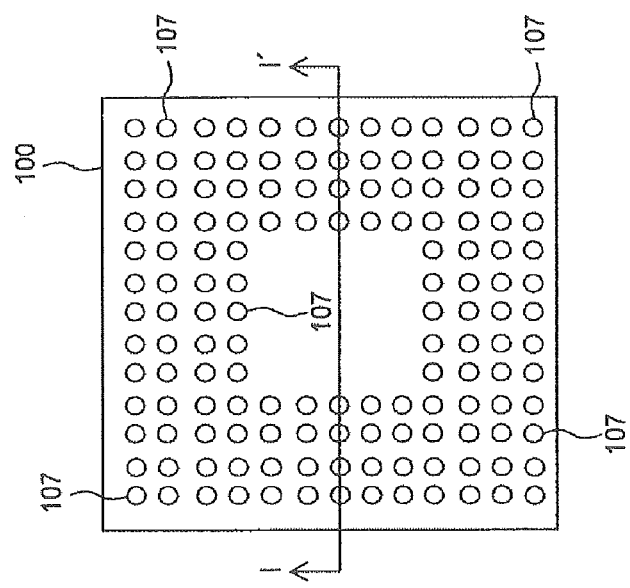
FIG. 14 is a plan view illustrating an arrangement state of external terminals of a control device.
Figure 15:
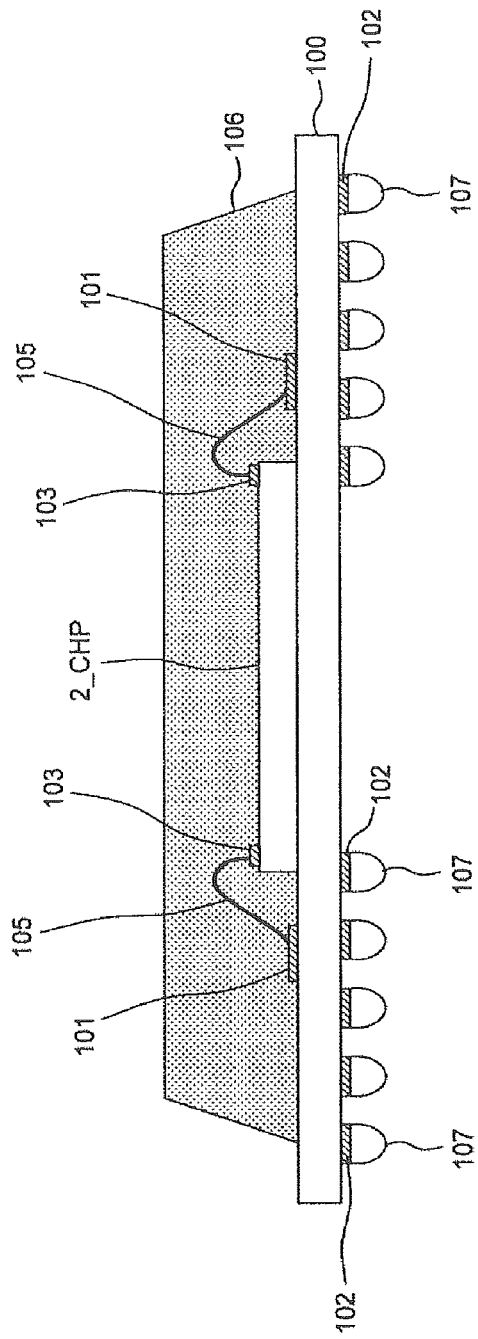
FIG. 15 is a cross-sectional view illustrating a I-I' cross section in FIG. 14 as details of a cross-sectional structure of the control device.
Figure 16:
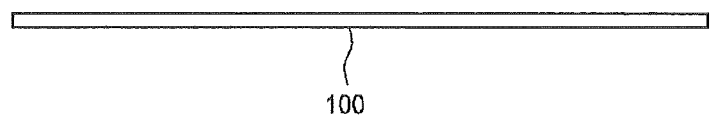
FIG. 16 is a cross-sectional view illustrating an assembled state of a base material preparation process in an assembly process of the control device.

FIG. 14 is a diagram of the lower surface (a mounting surface) of the control device 2. FIG. 15 is a cross-sectional view taken along a cross-sectional line I-I' shown in FIG. 14.

As shown in FIG. 15, the control device 2 includes an interposer (wiring substrate) 100, a control chip (semiconductor chip, logic chip) 2_CHP mounted on the upper surface (chip mounting surface) of the interposer 100, wires (conductive members) 105 that electrically couple bonding pads (electrodes) 103 formed over the main surface (element forming surface) of the control chip 2 with bonding leads 101 (electrodes) formed on the upper surface of the interposer 100, a sealing body (resin) 106 that seals the control chip 2 and the conductive members 105, bump lands (electrode pads) 102 which are formed on the lower surface (mounting surface) opposite to the upper surface of the interposer 100 and electrically coupled to the bonding leads 101 via inner layer wirings not shown in FIG. 15, and solder balls (external terminals) 107 bonded to surfaces of the bump lands 102.

In addition, as shown in FIG. 14, a plurality of bump lands 102 (or a plurality of solder balls 107) formed on the lower surface of the interposer 100 is arranged in a plurality of rows along each side of the lower surface of the interposer 100 in a plan view.

Meanwhile, although description of the configuration of the memory devices 11 to 18 will be omitted, the memory devices 11 to 18 may have the same configuration as that of the control device 2.

Manufacturing Method of Control Device

Next, a manufacturing method of the control device 2 of the present embodiment will be described below.

FIGS. 16 to 20 illustrate states in accordance with assembly processes of the control device 2. A manufacturing process of the control device 2 mainly includes a base material preparation process, a chip mounting (die bonding) process, a wire bonding process, a molding process, and a ball mounting process.

1. Base Material Preparation

In the base material preparation process (FIG. 16), a parent material is prepared. Although the parent material used in the present embodiment is not limited, the parent material is not a so-called multi-piece substrate, but a wiring substrate 100, whose planar shape is quadrangular and where the bonding leads 101 and the bump lands 102 are formed on the upper surface and the lower surface, respectively.

2. Die Bonding

Figure 17:
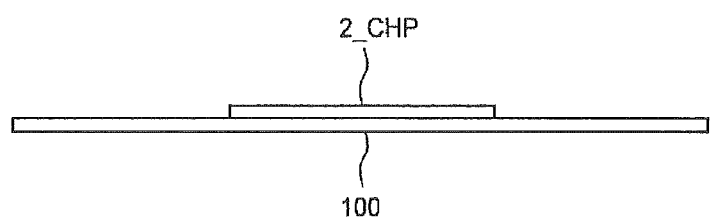
FIG. 17 is a cross-sectional view illustrating an assembled state of a base material preparation process in a chip mounting (die bonding) process.

In the chip mounting (die bonding) process, the controller chip 2_CHP such as a microcomputer chip is mounted on a device area of the wiring substrate 100 (see FIG. 17). The aforementioned controller chip 2_CHP is mounted on the upper surface (chip mounting surface) in the device area of the wiring substrate 100 via an adhesive (die bonding material). More specifically, the controller chip 2_CHP is mounted on the upper surface of the wiring substrate 100 through an adhesive (die bonding material) so that the back surface (rear surface) of the controller chip 2_CHP faces the upper surface of the wiring substrate 100. At this time, the controller chip 2_CHP is mounted so that a plurality of bonding leads 101 formed on the upper surface of the wiring substrate 100 is exposed from the controller chip 2_CHP. Meanwhile, the adhesive used here is, for example, a film-shaped adhesive having an insulating property. The adhesive may be a paste-type (flowable) adhesive (an adhesive having fluidity).

3. Wire Bonding

Figure 18:
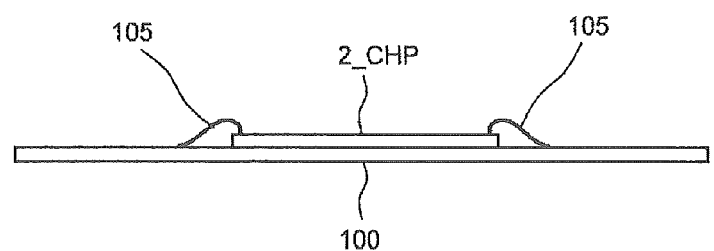
FIG. 18 is a cross-sectional view illustrating an assembled state of a base material preparation process in a wire bonding process.

In the wire bonding process, as shown in FIG. 18, the plurality of electrode pads 103 of the controller chip 2_CHP is electrically coupled to corresponding bonding leads 101, respectively, via the wires 105 which are conductive members.

Meanwhile, although the bonding pads of the controller chip 2 and the bonding pads (bonding fingers) of the wiring substrate 100, as conductive members, are electrically coupled to each other via the wires, the electrode pads (bonding pads) of the controller chip 2 and the electrode pads (bonding fingers) of the wiring substrate may be electrically coupled to each other via projection electrodes.

4. Molding

Figure 19:
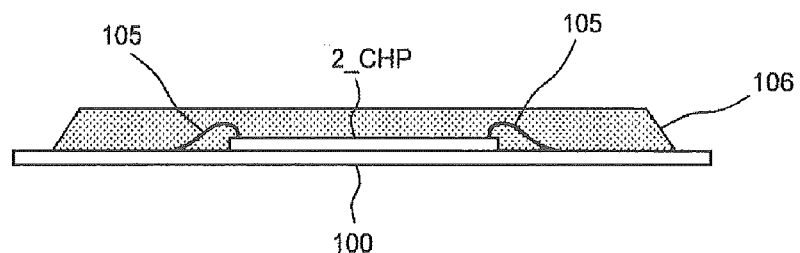
FIG. 19 is a cross-sectional view illustrating an assembled state of a base material preparation process in a molding process.

In the molding process, the sealing body 106 is formed by a so-called piece molding method in which one cavity formed in a mold covers one controller chip 2 so that the periphery of the wiring substrate 100 is exposed (see FIG. 19). For example, an epoxy-based thermosetting resin can be used for the sealing body 106.

It goes without saying that a multi-piece substrate including a plurality of device forming areas may be used as the wiring substrate and the sealing body may be formed by a so-called integral molding method in which a plurality of device areas is collectively covered by one cavity formed in a mold and devices are integrally molded.

5. Ball Mounting

Figure 20:
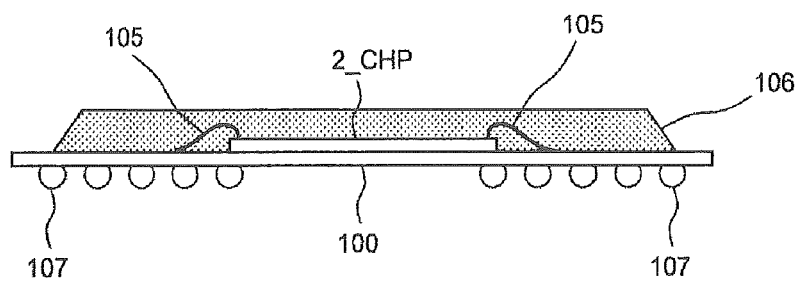
FIG. 20 is a cross-sectional view illustrating an assembled state of a base material preparation process in a ball mounting process.

In the ball mounting process, the wiring substrate 100 sealed by the sealing body 106 is taken out from a mold not shown in the drawings, and then the solder balls (solder materials) 107 to be external terminals are formed on (coupled to) the bump lands 102 formed on the lower surface of each device area (see FIG. 20). Meanwhile, as the solder balls 107, for example, a so-called lead-free solder material formed of an alloy of tin (Sn), silver (Ag), and copper (Cu) is used. In addition, the lead-free solder material is a material containing 1000 ppm (0.1 wt %) or less of lead (Pb) on the basis of RoHS (Restriction of Hazardous Substances) Directive. Furthermore, although the present embodiment can be applied also to a case where a solder material containing lead (Pb) is used in addition to a case where the lead-free solder material is used because copper (Cu) is easily diffused when a solder material containing tin (Sn) is used, it is preferable to use the lead-free solder material as in the present embodiment in consideration of environmental pollution control measures.

Meanwhile, an assembly process of the memory devices 11 to 18 includes substantially the same processes as those of the assembly of the control device 2, and thus the description will be omitted.

Manufacturing Method of Module Product (Electronic Device)

In a component mounting process in which semiconductor components such as the control device 2 and the memory devices 11 to 18 obtained by the assembly processes described above are mounted on the mounting substrate 3, the mounting order of main semiconductor components may be as follows: First, the control device 2 is mounted on a first surface (front surface) of the mounting substrate 3, then it is sufficient that a plurality of memory devices 11, 13, 15, and 17 may be mounted and after that, a plurality of memory devices 12, 14, 16, and 18 may be mounted on a second surface (back surface) of the mounting substrate 3. Alternatively, in reverse order, first, the memory devices 12, 14, 16, and 18 may be mounted on the second surface (back surface) of the mounting substrate 3, then the control device 2 may be mounted on the first surface (front surface) of the mounting substrate 3, and after that, the memory devices 11, 13, 15, and 17 may be mounted. It is sufficient that the termination resistors and the stub resistors may be mounted in accordance with the mounting order of the control device 2 and the memory devices 11 to 18.

According to the above embodiment, the working effects described below are obtained.

[1] The chip resistor RS_CA is inserted in the command/address signal branch wiring CALsb branched from the command/address signal main wiring CALmn of the fly-by topology of the command/address signal path CAL. According to this, the chip resistor RS_CA inserted in the command/address signal branch wiring CALsb branched from the command/address signal main wiring CALmn of the fly-by topology can alleviate the effect of undesired signal reflection in the command/address signal branch wiring CALsb even if the command/address signal branch wiring CALsb is long. Therefore, when trying to realize high-speed access to the memory devices 11 to 18 from the control device 2 by directly mounting the memory devices 11 to 18 on the mounting substrate 3 on which the control device 2 is mounted, by the fly-by topology, it is possible to suppress deterioration of the waveform quality of interface signal due to the fly-by topology. More specifically, when trying to realize high-speed access to the eight memory devices 11 to 18 from the control device 2 by directly mounting the memory devices 11 to 18, which are formed by i memory devices×j ranks (for example, 4 memory devices×2 ranks), on the mounting substrate 3 on which the control device 2 is mounted, by the fly-by topology, it is possible to suppress deterioration of the waveform quality of interface signal due to the fly-by topology. For example, FIG. 21 illustrates a signal waveform of the command/address signal branch wiring at a position near the control device 2 and a signal waveform of the command/address signal branch wiring at a position far from the control device 2, in distinction from each other when the chip resistor RS_CA is provided (solid line signal waveform) and when the chip resistor RS_CA is not provided (dashed line signal waveform. As clear from FIG. 21, in both cases, when the chip resistor RS_CA is provided, it is possible to suppress the effect of reflection.

When the i×j memory devices are semiconductor memory devices such as DDR3-SDRAMs in compliance with the JEDEC standard, the mapping of external terminals is standardized so that control signal terminals are arranged at a central portion of the device, data system terminals are arranged on one side of the device, and command/address signal terminals are arranged at the other side of the device. In this case, the command/address terminals are gathered on one side of the memory device, and thus it can be considered that all the branch points PSBcan and PSBcaf of the command/address signal branch wirings CALsb coupled to the command/address terminals often cannot be arranged so as to overlap the memory device near the command/address terminals. Furthermore, a clock signal (CK) that defines a cycle period of the command/address signals and a control system signal (CS) used for activation control of the memory devices are assumed to be signals related to the effectiveness of all bits of the command/address signals, and thus it is regarded as effective to take into account shortening as much as possible of the branch wirings CALsb corresponding to such signals in the fly-by topology. In that sense, all or part of the command/address signal branch wirings CALsb corresponding to the command/address signals are allowed to be long and the problem caused by that is solved by the chip resistors RSCA, and thus it is possible to reliably enhance the high-speed access performance to the memory devices.

Furthermore, there is another reason that the length of the stub wiring becomes long. That is, the size of mounting substrates tends to be reduced from the viewpoint of reducing the size of electronic devices, and thus large-capacity memories are used as memory devices and the memory devices are mounted not only on one side of the mounting substrate, but also on both sides of the mounting substrate. Under such circumstances, when trying to improve the waveform quality of the interface signals between the control device and the memory devices and perform high-speed operation, as the wiring topology between the control device and the memory devices, the use of wiring topology of fly-by structure instead of wiring topology of T-branch structure is regarded as promising. However, by doing so, the length of the stub wirings branched from the main wiring (the length from the branch point (through-hole) to an external terminal of each memory chip) becomes long. The reason for this is because the thickness of the mounting substrate of multilayer wiring structure such as a buildup substrate is larger than that of an interposer used for DIMM, and thus the diameter of the through-holes formed in the mounting substrate becomes large and all the through-holes cannot be arranged (formed) near the external terminals of the memory device. Specifically, the thickness (for example, 1.6 mm) of the mounting substrate is larger than that of the interposer used in DIMM, and thus the diameter (for example, 0.3 mm) of a drill used in forming through-holes in the mounting board has to be larger than the diameter (for example, 0.1 mm) of a drill used for the interposer of the DIMM. As a result, the diameter of formed through-holes is large, and thus all the through-holes cannot be arranged within the semiconductor component mounting area. Therefore, long branch wirings (stub wirings) coupled to penetrating wirings (through-hole wirings) formed in the through-holes provided outside the semiconductor component mounting area are generated, and it is assumed that the long branch wirings become a cause of degrading the signal quality. It is possible to suppress the degradation of signal waveform in the long branch wirings CALsb by inserting a stub resistor in each of the long branch wirings CALsb.

[2] The branch point of the clock signal wiring coupled to the memory device in the fly-by mode is not outside the mounting area of the memory device and the branch wiring of the clock signal wiring is not undesirably long, and thus the effect of signal reflection of the clock signal wiring is an ignorable level and it is not necessary to insert a chip resistor. On the contrary, when the branch point of the clock signal main wiring is located in an area not overlapping the memory device, in the same manner as the command/address signal, it is sufficient that a chip resistor may be inserted in the midway of the clock signal branch wiring coupled to the branch point.

[3] Deterioration of the waveform quality of the command/address signals is suppressed, and thus extension of a determining period of the command/address signals to a plurality of cycles of the clock signal is not required, and the command/address signals can be outputted in synchronization with the cycle of the clock signal, which is suitable for high-speed access to the memory devices.

[4] The branch point of the control signal wiring coupled to the memory device in the fly-by mode is not outside the mounting area of the memory device and the branch wiring of the control signal wiring is not undesirably long, and thus the effect of signal reflection of the control signal wiring is an ignorable level and it is not necessary to insert a chip resistor. On the contrary, when the branch point of the control signal main wiring is located in an area not overlapping the memory device, in the same manner as the command/address signal, it is sufficient that a chip resistor may be inserted in the midway of the control signal branch wiring coupled to the branch point.

[5] The data system wiring includes the data system signal main wiring DTLmn which is individual for each memory device in the same rank and is commonly provided for each corresponding memory device between two ranks and two data system signal branch wirings DTLsb which are branched at the data system signal branch point PSBd (branch point of the of the data system signal path) of the data system signal main wiring. At this time, the control device 2 can individually performs data input/output between the control device 2 and a memory device for each rank by performing data input or output between the control device 2 and a memory device in a rank activated by the chip select signal CS.

The command/address signal and the clock signal are inputted with a difference of phase to a plurality of memory devices in the same rank. This is because the path supplying the signals has a fly-by topology. The data system wiring is individually coupled to each of the memory devices in the same rank, and thus the difference of phase included in the command/address signal and the clock signal is formed in the output timing of the data system signal from the control device 2 to the memory devices in the same rank. The same applies to a case where the memory devices in the dame rank output read data. Therefore, the data output timing is deviated in accordance with the difference of phase, and thus it is possible to prevent power supply noise caused by an output operation of output buffer from being too large.

[6] As illustrated in FIG. 1, in the fly-by topology, the maximum distance between the branch points PSBcaf, that is, for example, the distance between the branch point PSBcaf at the near end side of the control device 2 (at the memory device 11 side) and the branch point PSBcaf at the far end side of the control device 2 (at the memory device 17 side), is set to longer than the distance between the control device 2 and the first stage branch point PSBcaf. This is because the memory devices are not in a mounting form using sockets like DIMMs, but the memory devices are in a mounting form in which the memory devices are directly mounted on the mounting substrate 3 by planarly stacking the memory devices 11 to 18. Even when there is a relationship between the wiring lengths of the command/address signals as described above due to the fly-by topology of such a mounting form, the disadvantage caused by the long branch wiring is solved by the stub resistor.

Modification

The present invention is not limited to the above embodiment, but it is needless to say that various modifications are possible within the scope not departing from the gist of the invention.

Modification 1

For example, although in the above embodiment, it has been described that each semiconductor component is assembled and then the semiconductor components are mounted over the mounting substrate, semiconductor components that have been completed may be prepared.

Modification 2

In addition, although in the above embodiment, it has been described that the command/address signal wirings are laid around mainly in the third wiring layer (internal wiring layer) in the mounting substrate having a multi-wiring layer structure, it is not limited to the third layer, but the command/address signal wirings may be laid around to the vicinity of each memory device in any internal wiring layer, for example, in the sixth layer.

Modification 3

Furthermore, the memory device mounted on the mounting substrate by the fly-by topology is not limited to the DDR3-SDRAM, but the memory device may be a memory having another configuration, and moreover, the memory device may be another semiconductor component.

Modification 4

In addition, the control device is not limited to a microcomputer, but may be an appropriate system-on-chip data processing device, a memory control device, or the like.

Modification 5

The i×j memory devices are not limited to the eight memory devices in two ranks. The number of ranks and the number of memory devices in one rank can be appropriately changed in accordance with the memory control function of the control device.

Modification 6

The type of signal line where a chip resistor is inserted as a stub resistor in its branch wiring is not limited to the address/command signal line. The type of signal line may be any type of signal line having branch points of fly-by topology which are away from positions overlapping each other on the front surface and the back surface of the semiconductor component.

Modification 7

Furthermore, it is possible to combine and apply the modifications within the scope not departing from the gist of the technical idea described in the above embodiment.

What is claimed is:

1. An electronic device, comprising:
   a mounting substrate;
   a first semiconductor component including a first semiconductor chip that operates in synchronization with a first clock signal and being mounted on a first semiconductor component mounting area of the mounting substrate;
   a second semiconductor component including a second semiconductor chip that operates in synchronization with a second clock signal and being mounted on a second semiconductor component mounting area of the mounting substrate, the second semiconductor component mounting area being next to the first semiconductor component mounting area; and
   a third semiconductor component including a third semiconductor chip that controls the first and second semiconductor chips and being mounted on a third semiconductor component mounting area of the mounting substrate, the third semiconductor component mounting area being next to the first and the second semiconductor component mounting areas,
   wherein the third semiconductor component is electrically coupled to the first semiconductor component and the second semiconductor component via a main wiring provided on the mounting substrate and a first branch wiring which is branched from the main wiring at a first branch point of the main wiring and the main wiring, and a second branch wiring which is branched from the main wiring at a second branch point of the main wiring, respectively, a third branch wiring of the main wiring extending between and connecting the first branch point and the second branch point,
   wherein the first branch point and the second branch point are arranged outside the first semiconductor component mounting area and the second semiconductor component mounting area, respectively,
   wherein a first chip resistor and a second chip resistor are coupled in series to the first branch wiring and the second branch wiring, respectively, and wherein a wiring length from the first branch point to the second branch point is longer than a wiring length from the control device to the first branch point.

2. The electronic device according to claim 1, wherein the first semiconductor component and the second semiconductor component include a first memory device and a second memory device which are operated in synchronization with a clock signal, and
wherein the third semiconductor component comprises a control device that controls the first memory device and the second memory device.

3. The electronic device according to claim 1, wherein the main wiring connects the third semiconductor component to the second semiconductor component through the first branch point and the second branch point.

4. The electronic device according to claim 1, wherein the first branch point and the second branch point are connected in series through the main wiring.

5. The electronic device according to claim 1, wherein the third semiconductor component is connected to the second semiconductor component only through the first branch point.

6. The electronic device according to claim 2, wherein the main wiring includes a command signal main wiring or an address signal main wiring, and
wherein the branch wirings include command signal main wirings or address signal branch wirings.

7. The electronic device according to claim 3, wherein the third semiconductor component is connected to the second semiconductor component only through the first branch point.

8. The electronic device according to claim 6, wherein a clock signal is supplied from the control device to the first memory device and the second memory device via a clock signal main wiring provided on the mounting substrate and clock signal branch wirings branched from the clock signal main wiring at first and second branch points of the clock signal main wiring, respectively.

9. The electronic device according to claim 6, wherein a control signal is supplied from the control device to the first memory device and the second memory device via a control signal main wiring provided on the mounting substrate and control signal branch wirings branched from the control signal main wiring at first and second branch points of the control signal main wiring, respectively.

10. The electronic device according to claim 8, wherein the control device outputs a signal to the command signal main wiring or the address signal main wiring for each cycle of the clock signal to be output to the clock signal main wiring.

11. The electronic device according to claim 10, wherein the mounting substrate includes a first data system wiring that couples the control device to the first memory device and a second data system wiring that couples the control device to the second memory device, and
wherein the control device performs data input or output among the control device, and the first memory device and the second memory device which are activated by the control signal.

* * * * *